US008531055B2

(12) United States Patent
Adest et al.

(10) Patent No.: US 8,531,055 B2
(45) Date of Patent: Sep. 10, 2013

(54) SAFETY MECHANISMS, WAKE UP AND SHUTDOWN METHODS IN DISTRIBUTED POWER INSTALLATIONS

(75) Inventors: Meir Adest, Raanana (IL); Guy Sella, Bitan Aharon (IL); Lior Handelsman, Givataim (IL); Yoav Galin, Raanana (IL); Amir Fishelov, Tel Aviv (IL); Meir Gazit, Ashkelon (IL); Yaron Binder, Haifa (IL)

(73) Assignee: Solaredge Ltd., Herzelia (IL)

( * ) Notice: Subject to any disclaimer, the term of this patent is extended or adjusted under 35 U.S.C. 154(b) by 24 days.

(21) Appl. No.: 12/329,525

(22) Filed: Dec. 5, 2008

(65) Prior Publication Data
US 2009/0140715 A1 Jun. 4, 2009

Related U.S. Application Data

(63) Continuation-in-part of application No. 11/950,271, filed on Dec. 4, 2007.

(60) Provisional application No. 60/868,893, filed on Dec. 6, 2006, provisional application No. 60/868,851, filed on Dec. 6, 2006, provisional application No. 60/868,962, filed on Dec. 7, 2006, provisional application No. 60/908,095, filed on Mar. 26, 2007, provisional application No. 60/916,815, filed on May 9, 2007, provisional application No. 60/992,589, filed on Dec. 5, 2007.

(51) Int. Cl.
*H02J 1/10* (2006.01)

(52) U.S. Cl.
USPC .................. 307/43; 307/85; 307/86; 307/97

(58) Field of Classification Search
None
See application file for complete search history.

(56) References Cited

U.S. PATENT DOCUMENTS

| | | |
|---|---|---|
| 3,369,210 A | 2/1968 | Manickella |
| 3,596,229 A | 7/1971 | Hohorst |
| 3,958,136 A | 5/1976 | Schroeder |
| 4,060,757 A | 11/1977 | McMurray |
| 4,101,816 A | 7/1978 | Shepter |
| 4,171,861 A | 10/1979 | Hohorst |
| 4,257,087 A | 3/1981 | Cuk |
| 4,452,867 A | 6/1984 | Conforti |

(Continued)

FOREIGN PATENT DOCUMENTS

| | | |
|---|---|---|
| CN | 1309451 A | 8/2001 |
| DE | 19737286 | 3/1999 |

(Continued)

OTHER PUBLICATIONS

Control of single-stage single-phase PV inverter, to Ciobotaru et al., Aug. 7, 2006.*

(Continued)

*Primary Examiner* — Hal Kaplan
(74) *Attorney, Agent, or Firm* — Banner & Witcoff, Ltd.

(57) ABSTRACT

A distributed power system including multiple DC power sources and multiple power modules. The power modules include inputs coupled respectively to the DC power sources and outputs coupled in series to form a serial string. An inverter is coupled to the serial string. The inverter converts power input from the serial string to output power. A signaling mechanism between the inverter and the power module is adapted for controlling operation of the power modules.

18 Claims, 8 Drawing Sheets

(56) References Cited

U.S. PATENT DOCUMENTS

| | | |
|---|---|---|
| 4,460,232 A | 7/1984 | Sotolongo |
| 4,481,654 A | 11/1984 | Daniels et al. |
| 4,554,515 A | 11/1985 | Burson et al. |
| 4,598,330 A | 7/1986 | Woodworth |
| 4,602,322 A | 7/1986 | Merrick |
| 4,623,753 A | 11/1986 | Feldman et al. |
| 4,637,677 A | 1/1987 | Barkus |
| 4,641,042 A * | 2/1987 | Miyazawa ............ 307/66 |
| 4,641,079 A | 2/1987 | Kato et al. |
| 4,644,458 A | 2/1987 | Harafuji et al. |
| 4,652,770 A * | 3/1987 | Kumano ............ 307/66 |
| 4,706,181 A | 11/1987 | Mercer |
| 4,720,667 A | 1/1988 | Lee et al. |
| 4,720,668 A | 1/1988 | Lee et al. |
| 4,783,728 A | 11/1988 | Hoffman |
| RE33,057 E | 9/1989 | Clegg et al. |
| 4,868,379 A | 9/1989 | West |
| 4,888,063 A | 12/1989 | Powell |
| 4,888,702 A | 12/1989 | Gerken et al. |
| 4,899,269 A | 2/1990 | Rouzies |
| 4,903,851 A | 2/1990 | Slough |
| 4,910,518 A | 3/1990 | Kim et al. |
| 4,978,870 A | 12/1990 | Chen et al. |
| 4,987,360 A | 1/1991 | Thompson |
| 5,045,988 A | 9/1991 | Gritter et al. |
| 5,081,558 A | 1/1992 | Mahler |
| 5,191,519 A | 3/1993 | Kawakami |
| 5,280,232 A | 1/1994 | Kohl et al. |
| 5,287,261 A | 2/1994 | Ehsani |
| 5,327,071 A | 7/1994 | Frederick et al. |
| 5,345,375 A * | 9/1994 | Mohan ............ 363/40 |
| 5,402,060 A | 3/1995 | Erisman |
| 5,446,645 A | 8/1995 | Shirahama et al. |
| 5,460,546 A | 10/1995 | Kunishi et al. |
| 5,493,154 A | 2/1996 | Smith et al. |
| 5,497,289 A | 3/1996 | Sugishima et al. |
| 5,517,378 A | 5/1996 | Asplund et al. |
| 5,548,504 A | 8/1996 | Takehara |
| 5,604,430 A | 2/1997 | Decker et al. |
| 5,616,913 A | 4/1997 | Litterst |
| 5,644,219 A | 7/1997 | Kurokawa |
| 5,646,501 A | 7/1997 | Fishman et al. |
| 5,659,465 A | 8/1997 | Flack et al. |
| 5,686,766 A | 11/1997 | Tamechika |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,798,631 A | 8/1998 | Spee et al. |
| 5,801,519 A | 9/1998 | Midya et al. |
| 5,804,894 A | 9/1998 | Leeson et al. |
| 5,821,734 A | 10/1998 | Faulk |
| 5,822,186 A | 10/1998 | Bull et al. |
| 5,838,148 A | 11/1998 | Kurokami et al. |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,905,645 A | 5/1999 | Cross |
| 5,919,314 A | 7/1999 | Kim |
| 5,923,158 A | 7/1999 | Kurokami et al. |
| 5,932,994 A | 8/1999 | Jo et al. |
| 5,933,327 A | 8/1999 | Leighton et al. |
| 5,945,806 A | 8/1999 | Faulk |
| 5,949,668 A | 9/1999 | Schweighofer |
| 5,963,010 A | 10/1999 | Hayashi et al. |
| 5,990,659 A | 11/1999 | Frannhagen |
| 6,002,290 A | 12/1999 | Avery et al. |
| 6,031,736 A | 2/2000 | Takehara et al. |
| 6,037,720 A | 3/2000 | Wong et al. |
| 6,038,148 A | 3/2000 | Farrington et al. |
| 6,046,919 A | 4/2000 | Madenokouji et al. |
| 6,050,779 A | 4/2000 | Nagao et al. |
| 6,078,511 A | 6/2000 | Fasulla et al. |
| 6,081,104 A | 6/2000 | Kern |
| 6,082,122 A | 7/2000 | Madenokouji et al. |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,219,623 B1 | 4/2001 | Wills |
| 6,255,360 B1 | 7/2001 | Domschke et al. |
| 6,256,234 B1 | 7/2001 | Keeth et al. |
| 6,259,234 B1 | 7/2001 | Perol |
| 6,262,558 B1 | 7/2001 | Weinberg |
| 6,285,572 B1 | 9/2001 | Onizuka et al. |
| 6,292,379 B1 | 9/2001 | Edevold et al. |
| 6,301,128 B1 | 10/2001 | Jang et al. |
| 6,304,065 B1 | 10/2001 | Wittenbreder |
| 6,320,769 B2 | 11/2001 | Kurokami et al. |
| 6,339,538 B1 | 1/2002 | Handleman |
| 6,351,130 B1 | 2/2002 | Preiser et al. |
| 6,369,462 B1 | 4/2002 | Siri |
| 6,380,719 B2 * | 4/2002 | Underwood et al. ........... 322/36 |
| 6,396,170 B1 | 5/2002 | Laufenberg et al. |
| 6,433,522 B1 | 8/2002 | Siri |
| 6,448,489 B2 | 9/2002 | Kimura et al. |
| 6,452,814 B1 | 9/2002 | Wittenbreder |
| 6,493,246 B2 | 12/2002 | Suzui et al. |
| 6,507,176 B2 | 1/2003 | Wittenbreder, Jr. |
| 6,531,848 B1 | 3/2003 | Chitsazan et al. |
| 6,545,211 B1 | 4/2003 | Mimura |
| 6,548,205 B2 | 4/2003 | Leung et al. |
| 6,587,051 B2 | 7/2003 | Takehara et al. |
| 6,590,793 B1 | 7/2003 | Nagao et al. |
| 6,593,521 B2 | 7/2003 | Kobayashi |
| 6,608,468 B2 | 8/2003 | Nagase |
| 6,611,130 B2 | 8/2003 | Chang |
| 6,611,441 B2 | 8/2003 | Kurokami et al. |
| 6,628,011 B2 | 9/2003 | Droppo et al. |
| 6,650,031 B1 | 11/2003 | Goldack |
| 6,650,560 B2 | 11/2003 | MacDonald et al. |
| 6,653,549 B2 | 11/2003 | Matsushita et al. |
| 6,672,018 B2 | 1/2004 | Shingleton |
| 6,678,174 B2 | 1/2004 | Suzui et al. |
| 6,690,590 B2 | 2/2004 | Stamenic et al. |
| 6,731,136 B2 | 5/2004 | Knee |
| 6,738,692 B2 | 5/2004 | Schienbein et al. |
| 6,744,643 B2 | 6/2004 | Luo et al. |
| 6,765,315 B2 | 7/2004 | Hammerstrom et al. |
| 6,768,047 B2 | 7/2004 | Chang et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,801,442 B2 | 10/2004 | Suzui et al. |
| 6,850,074 B2 | 2/2005 | Adams et al. |
| 6,882,131 B2 | 4/2005 | Takada et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 * | 8/2005 | Wilhelm ............ 307/66 |
| 6,936,995 B2 | 8/2005 | Kapsokavathis et al. |
| 6,950,323 B2 | 9/2005 | Achleitner et al. |
| 6,963,147 B2 | 11/2005 | Kurokami et al. |
| 6,984,967 B2 | 1/2006 | Notman |
| 6,984,970 B2 | 1/2006 | Capel |
| 7,030,597 B2 | 4/2006 | Bruno et al. |
| 7,031,176 B2 | 4/2006 | Kotsopoulos et al. |
| 7,042,195 B2 | 5/2006 | Tsunetsugu et al. |
| 7,046,531 B2 | 5/2006 | Zocchi et al. |
| 7,053,506 B2 | 5/2006 | Alonso et al. |
| 7,072,194 B2 | 7/2006 | Nayar et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,091,707 B2 | 8/2006 | Cutler |
| 7,097,516 B2 | 8/2006 | Werner et al. |
| 7,099,169 B2 | 8/2006 | West et al. |
| 7,126,053 B2 | 10/2006 | Kurokami et al. |

| | | |
|---|---|---|
| 7,126,294 B2 | 10/2006 | Minami et al. |
| 7,138,786 B1 | 11/2006 | Ishigaki et al. |
| 7,148,669 B2 | 12/2006 | Maksimovic et al. |
| 7,158,359 B2 | 1/2007 | Bertele et al. |
| 7,158,395 B2 | 1/2007 | Deng et al. |
| 7,174,973 B1 | 2/2007 | Lysaght |
| 7,193,872 B2 | 3/2007 | Siri |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,277,304 B2 | 10/2007 | Stancu et al. |
| 7,281,141 B2 | 10/2007 | Elkayam et al. |
| 7,282,814 B2 | 10/2007 | Jacobs |
| 7,291,036 B1 | 11/2007 | Daily et al. |
| RE39,976 E | 1/2008 | Schiff |
| 7,336,056 B1 | 2/2008 | Dening |
| 7,348,802 B2 | 3/2008 | Kasanyal et al. |
| 7,352,154 B2 | 4/2008 | Cook |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,394,237 B2 | 7/2008 | Chou et al. |
| 7,420,815 B2 | 9/2008 | Love |
| 7,435,134 B2 | 10/2008 | Lenox |
| 7,435,897 B2 | 10/2008 | Russell |
| 7,471,014 B2 | 12/2008 | Lum et al. |
| 7,504,811 B2 | 3/2009 | Watanabe et al. |
| 7,589,437 B2 | 9/2009 | Henne et al. |
| 7,600,349 B2 | 10/2009 | Liebendorfer |
| 7,602,080 B1 | 10/2009 | Hadar et al. |
| 7,605,498 B2 | 10/2009 | Ledenev et al. |
| 7,612,283 B2 | 11/2009 | Toyomura et al. |
| 7,646,116 B2 | 1/2010 | Baraseh et al. |
| 7,719,140 B2 | 5/2010 | Ledenev et al. |
| 7,748,175 B2 | 7/2010 | Liebendorfer |
| 7,759,575 B2 | 7/2010 | Jones et al. |
| 7,763,807 B2 | 7/2010 | Richter |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,812,701 B2 | 10/2010 | Lee et al. |
| 7,839,022 B2 | 11/2010 | Wolfs |
| 7,843,085 B2 | 11/2010 | Ledenev et al. |
| 7,868,599 B2 | 1/2011 | Rahman et al. |
| 7,880,334 B2 | 2/2011 | Evans et al. |
| 7,893,346 B2 | 2/2011 | Nachamkin et al. |
| 7,900,361 B2 | 3/2011 | Adest et al. |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,944,191 B2 | 5/2011 | Xu |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 8,003,885 B2 | 8/2011 | Richter et al. |
| 8,004,116 B2 | 8/2011 | Ledenev et al. |
| 8,004,117 B2 | 8/2011 | Adest et al. |
| 8,013,472 B2 | 9/2011 | Adest et al. |
| 8,018,748 B2 | 9/2011 | Leonard |
| 8,058,747 B2 | 11/2011 | Avrutsky et al. |
| 8,058,752 B2 | 11/2011 | Erickson, Jr. et al. |
| 8,077,437 B2 | 12/2011 | Mumtaz et al. |
| 8,093,756 B2 | 1/2012 | Porter et al. |
| 8,093,757 B2 | 1/2012 | Wolfs |
| 8,098,055 B2 | 1/2012 | Avrutsky et al. |
| 8,111,052 B2 | 2/2012 | Glovinsky |
| 8,116,103 B2 | 2/2012 | Zacharias et al. |
| 8,138,914 B2 | 3/2012 | Wong et al. |
| 8,184,460 B2 | 5/2012 | O'Brien et al. |
| 8,204,709 B2 | 6/2012 | Presher, Jr. et al. |
| 8,289,742 B2 | 10/2012 | Adest et al. |
| 8,415,937 B2 | 4/2013 | Hester |
| 8,436,592 B2 | 5/2013 | Saitoh |
| 2001/0023703 A1 | 9/2001 | Kondo et al. |
| 2001/0034982 A1 | 11/2001 | Nagao et al. |
| 2002/0044473 A1 | 4/2002 | Toyomura et al. |
| 2002/0056089 A1 | 5/2002 | Houston |
| 2003/0058593 A1 | 3/2003 | Bertele et al. |
| 2003/0066076 A1 | 4/2003 | Minahan |
| 2003/0075211 A1 | 4/2003 | Makita et al. |
| 2003/0080741 A1 | 5/2003 | LeRow et al. |
| 2003/0214274 A1 | 11/2003 | Lethellier |
| 2004/0041548 A1 | 3/2004 | Perry |
| 2004/0061527 A1 | 4/2004 | Knee |
| 2004/0125618 A1 | 7/2004 | De Rooij |
| 2004/0140719 A1* | 7/2004 | Vulih et al. .................. 307/80 |
| 2004/0169499 A1 | 9/2004 | Huang et al. |
| 2004/0201279 A1 | 10/2004 | Templeton |
| 2004/0201933 A1 | 10/2004 | Blanc |
| 2004/0246226 A1 | 12/2004 | Moon |
| 2005/0002214 A1 | 1/2005 | Deng et al. |
| 2005/0005785 A1 | 1/2005 | Poss et al. |
| 2005/0017697 A1 | 1/2005 | Capel |
| 2005/0057214 A1 | 3/2005 | Matan |
| 2005/0057215 A1 | 3/2005 | Matan |
| 2005/0068820 A1 | 3/2005 | Radosevich et al. |
| 2005/0099138 A1* | 5/2005 | Wilhelm .................. 315/209 R |
| 2005/0103376 A1 | 5/2005 | Matsushita et al. |
| 2005/0105224 A1 | 5/2005 | Nishi |
| 2005/0121067 A1 | 6/2005 | Toyomura et al. |
| 2005/0162018 A1 | 7/2005 | Realmuto et al. |
| 2005/0172995 A1 | 8/2005 | Rohrig et al. |
| 2005/0226017 A1* | 10/2005 | Kotsopoulos et al. ........ 363/125 |
| 2005/0281064 A1 | 12/2005 | Olsen et al. |
| 2006/0001406 A1 | 1/2006 | Matan |
| 2006/0017327 A1* | 1/2006 | Siri et al. .................... 307/43 |
| 2006/0034106 A1 | 2/2006 | Johnson |
| 2006/0038692 A1 | 2/2006 | Schnetker |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0108979 A1 | 5/2006 | Daniel et al. |
| 2006/0113843 A1* | 6/2006 | Beveridge .................... 307/43 |
| 2006/0113979 A1 | 6/2006 | Ishigaki et al. |
| 2006/0118162 A1 | 6/2006 | Saelzer et al. |
| 2006/0132102 A1 | 6/2006 | Harvey |
| 2006/0149396 A1 | 7/2006 | Templeton |
| 2006/0162772 A1 | 7/2006 | Presher, Jr. et al. |
| 2006/0163946 A1 | 7/2006 | Henne et al. |
| 2006/0171182 A1* | 8/2006 | Siri et al. .................... 363/131 |
| 2006/0174939 A1 | 8/2006 | Matan |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0227578 A1 | 10/2006 | Datta et al. |
| 2006/0237058 A1 | 10/2006 | McClintock et al. |
| 2007/0013349 A1 | 1/2007 | Bassett |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0147075 A1 | 6/2007 | Bang |
| 2007/0159866 A1 | 7/2007 | Siri |
| 2007/0164612 A1 | 7/2007 | Wendt et al. |
| 2007/0164750 A1 | 7/2007 | Chen |
| 2007/0165347 A1* | 7/2007 | Wendt et al. .................. 361/92 |
| 2007/0205778 A1 | 9/2007 | Fabbro et al. |
| 2007/0227574 A1 | 10/2007 | Cart |
| 2007/0236187 A1 | 10/2007 | Wai et al. |
| 2007/0247877 A1 | 10/2007 | Kwon et al. |
| 2007/0273342 A1 | 11/2007 | Kataoka et al. |
| 2007/0290636 A1 | 12/2007 | Beck et al. |
| 2008/0024098 A1 | 1/2008 | Hojo |
| 2008/0080177 A1 | 4/2008 | Chang |
| 2008/0088184 A1 | 4/2008 | Tung et al. |
| 2008/0097655 A1 | 4/2008 | Hadar et al. |
| 2008/0106250 A1 | 5/2008 | Prior et al. |
| 2008/0115823 A1 | 5/2008 | Kinsey |
| 2008/0136367 A1 | 6/2008 | Adest et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0150366 A1 | 6/2008 | Adest et al. |

| Publication No. | Date | Inventor |
|---|---|---|
| 2008/0164766 A1 | 7/2008 | Adest et al. |
| 2008/0179949 A1 | 7/2008 | Besser et al. |
| 2008/0218152 A1 | 9/2008 | Bo |
| 2008/0236647 A1* | 10/2008 | Gibson et al. .................. 136/244 |
| 2008/0236648 A1 | 10/2008 | Klein et al. |
| 2008/0238195 A1 | 10/2008 | Shaver et al. |
| 2008/0246460 A1 | 10/2008 | Smith |
| 2008/0246463 A1 | 10/2008 | Sinton et al. |
| 2008/0252273 A1 | 10/2008 | Woo et al. |
| 2008/0303503 A1 | 12/2008 | Wolfs |
| 2009/0039852 A1 | 2/2009 | Fishelov et al. |
| 2009/0066399 A1 | 3/2009 | Chen et al. |
| 2009/0073726 A1* | 3/2009 | Babcock .......................... 363/20 |
| 2009/0084570 A1 | 4/2009 | Gherardini et al. |
| 2009/0097172 A1 | 4/2009 | Bremicker et al. |
| 2009/0102440 A1 | 4/2009 | Coles |
| 2009/0121549 A1 | 5/2009 | Leonard |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0184746 A1 | 7/2009 | Fahrenbruch |
| 2009/0190275 A1 | 7/2009 | Gilmore et al. |
| 2009/0206666 A1 | 8/2009 | Sella et al. |
| 2009/0224817 A1 | 9/2009 | Nakamura et al. |
| 2009/0237042 A1 | 9/2009 | Glovinsky |
| 2009/0237043 A1 | 9/2009 | Glovinsky |
| 2009/0242011 A1 | 10/2009 | Proisy et al. |
| 2009/0273421 A1 | 11/2009 | Cros et al. |
| 2009/0282755 A1 | 11/2009 | Abbott et al. |
| 2009/0284998 A1 | 11/2009 | Zhang et al. |
| 2009/0322494 A1 | 12/2009 | Lee |
| 2010/0001587 A1 | 1/2010 | Casey et al. |
| 2010/0052735 A1 | 3/2010 | Burkland et al. |
| 2010/0085670 A1 | 4/2010 | Palaniswami et al. |
| 2010/0124027 A1 | 5/2010 | Handelsman et al. |
| 2010/0127571 A1 | 5/2010 | Hadar et al. |
| 2010/0139743 A1 | 6/2010 | Hadar et al. |
| 2010/0176773 A1 | 7/2010 | Capel |
| 2010/0181957 A1 | 7/2010 | Goeltner |
| 2010/0214808 A1* | 8/2010 | Rodriguez ....................... 363/37 |
| 2010/0244575 A1 | 9/2010 | Coccia et al. |
| 2010/0269430 A1 | 10/2010 | Haddock et al. |
| 2010/0277001 A1 | 11/2010 | Wagoner |
| 2010/0282290 A1 | 11/2010 | Schwarze et al. |
| 2010/0294903 A1 | 11/2010 | Shmukler et al. |
| 2010/0301991 A1 | 12/2010 | Sella et al. |
| 2010/0308662 A1 | 12/2010 | Schatz et al. |
| 2011/0006743 A1 | 1/2011 | Fabbro |
| 2011/0043172 A1 | 2/2011 | Dearn |
| 2011/0084553 A1 | 4/2011 | Adest et al. |
| 2011/0114154 A1 | 5/2011 | Lichy et al. |
| 2011/0121652 A1 | 5/2011 | Sella et al. |
| 2011/0125431 A1 | 5/2011 | Adest et al. |
| 2011/0140536 A1 | 6/2011 | Adest et al. |
| 2011/0181251 A1 | 7/2011 | Porter et al. |
| 2011/0210611 A1 | 9/2011 | Ledenev et al. |
| 2011/0254372 A1* | 10/2011 | Haines et al. .................... 307/66 |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0285205 A1 | 11/2011 | Ledenev et al. |
| 2011/0290317 A1 | 12/2011 | Naumovitz et al. |
| 2011/0291486 A1 | 12/2011 | Adest et al. |
| 2011/0316346 A1 | 12/2011 | Porter et al. |
| 2012/0007613 A1 | 1/2012 | Gazit |
| 2012/0032515 A1 | 2/2012 | Ledenev et al. |
| 2012/0091810 A1 | 4/2012 | Aiello et al. |

FOREIGN PATENT DOCUMENTS

| | | |
|---|---|---|
| DE | 102005030907 | 1/2007 |
| DE | 102008057874 | 5/2010 |
| EP | 0419093 | 3/1991 |
| EP | 0420295 A1 | 4/1991 |
| EP | 0604777 A1 | 7/1994 |
| EP | 0756178 | 1/1997 |
| EP | 0827254 | 3/1998 |
| EP | 1039621 A2 | 9/2000 |
| EP | 1330009 | 7/2003 |
| EP | 1503490 | 2/2005 |
| EP | 1531542 A2 | 5/2005 |
| EP | 1531545 A2 | 5/2005 |
| EP | 1657557 | 5/2006 |
| EP | 1657797 A1 | 5/2006 |
| EP | 1887675 | 2/2008 |
| EP | 2048679 | 4/2010 |
| ES | 2249147 | 3/2006 |
| ES | 2249149 | 3/2006 |
| JP | 61065320 | 4/1986 |
| JP | 6165320 | 5/1986 |
| JP | 8009557 A | 1/1996 |
| JP | 11041832 | 2/1999 |
| JP | 11103538 | 4/1999 |
| JP | 11206038 A | 7/1999 |
| JP | 11289891 A | 10/1999 |
| JP | 2000339044 A | 12/2000 |
| JP | 2002300735 A | 10/2002 |
| JP | 2003124492 | 4/2003 |
| JP | 2003-134667 A | 5/2003 |
| JP | 2004260944 A | 9/2004 |
| JP | 2004334704 A | 11/2004 |
| JP | 2005192314 A | 7/2005 |
| JP | 2007-058845 A | 3/2007 |
| WO | WO 93/13587 A1 | 7/1993 |
| WO | WO 96/13093 A1 | 5/1996 |
| WO | 9823021 | 5/1998 |
| WO | WO 98/23021 A2 | 5/1998 |
| WO | 0000839 | 1/2000 |
| WO | 0021178 | 4/2000 |
| WO | 0075947 | 12/2000 |
| WO | 0231517 | 4/2002 |
| WO | WO 03/050938 A2 | 6/2003 |
| WO | WO 03/071655 A1 | 8/2003 |
| WO | WO 2004/023278 A2 | 3/2004 |
| WO | WO 2004/090993 A2 | 10/2004 |
| WO | 2004107543 | 12/2004 |
| WO | 2005076444 | 8/2005 |
| WO | WO 2005/076445 A1 | 8/2005 |
| WO | 2006005125 | 1/2006 |
| WO | 2006007198 | 1/2006 |
| WO | WO 2006/078685 A2 | 7/2006 |
| WO | WO 2007/006564 A2 | 1/2007 |
| WO | 2007048421 | 5/2007 |
| WO | 2007073951 | 7/2007 |
| WO | WO 2007/084196 A2 | 7/2007 |
| WO | 2007090476 | 8/2007 |
| WO | WO 2007/113358 A1 | 10/2007 |
| WO | 2008008528 A2 | 1/2008 |
| WO | 2008125915 | 10/2008 |
| WO | 2008132551 | 11/2008 |
| WO | 2008132553 | 11/2008 |
| WO | 2008142480 | 11/2008 |
| WO | 2009046533 A1 | 4/2009 |
| WO | 2009051853 | 4/2009 |
| WO | 2010/002960 A1 | 1/2010 |
| WO | 2010065388 | 6/2010 |
| WO | 2010072717 | 7/2010 |
| WO | 2011011711 | 1/2011 |
| WO | 2011017721 | 2/2011 |

OTHER PUBLICATIONS

International Search Report for PCT/IB2007/004610 dated Feb. 23, 2009.

International Search Report for PCT/IB2007/004584 dated Jan. 28, 2009.

International Search Report for PCT/IB2007/004586 dated Mar. 5, 2009.

International Search Report for PCT/IB2007/004643 dated Jan. 30, 2009.

International Search Report for PCT/US2008/085736 dated Jan. 28, 2009.

International Search Report for PCT/US2008/085754 dated Feb. 9, 2009.

International Search Report for PCT/US2008/085755 dated Feb. 3, 2009.

Atsushi Kajihara, et al. "Model of Photovoltaic Cell Circuits Under Partial Shading," 2005 IEEE, pp. 866-870.
Werner Knaupp, et al., "Operation of a 10 KW PV Façade with 100 W AC Photovoltaic Modules," 1996 IEEE, 25th PVSC, May 13-17, 1996, pp. 1235-1238, Washington, D.C.
O. Alonso, et al., "Cascaded H-Bridge Multilevel Converter for Grid Connected Photovoltaic Generators with Independent Maximum Power Point Tracking of Each Solar Array," 2003 IEEE 34th, Annual Power Electronics Specialists Conference, Acapulco, Mexico, Jun. 15-19, 2003, pp. 731-735, vol. 2.
J.M.A. Myrzik, et al., "String and Module Integrated Inverters for Single-Phase Grid Connected Photovoltaic Systems—A Review," Power Tech Conference Proceedings, 2003 IEEE Bologna, Jun. 23-26, 2003 p. 8, vol. 2.
Jingquan Chen, et al., "Predictive Digital Current Programmed Control," IEEE Transactions on Power Electronics, vol. 18, Issue 1, Jan. 2003.
K. Wallace, et al, "DSP Controlled Buck/Boost Power Factor Correction for Telephony Rectifiers," Telecommunications Energy Conference, 2001. INTELEC 2001. Twenty-Third International, Oct. 18, 2001, pp. 132-138.
Alonso, R., "A New Distributed Converter Interface for PV Panels," 20th European Photovoltaic Solar Energy Conference, Jun. 6-10, 2005, Barcelona, Spain. pp. 2288-2291.
Alonso, R., "Experimental Results of Intelligent PV Module for Grid-Connected PV Systems," 21st European Photovoltaic Solar Energy Conference, Sep. 4-8, 2006, Dresden, Germany.pp. 2297-2300.
Enslin, Johan H. R., "Integrated Photovoltaic Maximum Power Point Tracking Converter," IEEE Transactions on Industrial Electronics, vol. 44, No. 6, Dec. 1997. pp. 769-773.
Lindgren, Bjorn, "Topology for Decentralised Solar Energy Inverters with a Low Voltage AC-Bus," Chalmers University of Technology, Department of Electrical Power Engineering, EPE '99—Lausanne.
Nikraz, Magid, "Digital Control of a Voltage Source Inverter in Photovoltaic Applications," 2004 35th Annual IEEE Power Electronics Specialists Conference, Aachen, Germany, 2004. pp. 3266-3271.
Orduz, R., "Evaluation Test Results of a New Distributed MPPT Converter," 22nd European Photovoltaic Solar Energy Conference, Sep. 3-7, 2007, Milan, Italy.
Palma, L., "A Modular Fuel Cell, Modular DC-DC Converter Concept for High Performance and Enhanced Reliability," IEEE 2007. pp. 2633-2638.
Quaschning, Volker, "Cost Effectiveness of Shadow Tolerant Photovoltaic Systems," Berlin University of Technology, Institute of Electrical Energy Technology, Renewable Energy Section. EuroSun'96. pp. 819-824.
Roman, E., "Intelligent PV Module for Grid-Connected PV Systems," IEEE Transactions on Industrial Electronics, vol. 53, No. 4, Aug. 2006. pp. 1066-1073.
Roman, E., "Power Line Communications in Modular PV Systems," 20th European Photovoltaic Solar Energy Conference, Jun. 6-10, 2005, Barcelona, Spain. pp. 2249-2252.
Uriarte, S., "Energy Integrated Management System for PV Applications," 20th European Photovoltaic Solar Energy Conference, Jun. 6-10, 2005, Barcelona, Spain. pp. 2292-2295.
Walker, Geoffrey R., "Cascaded DC-DC Converter Connection of Photovoltaic Modules," IEEE Transactions on Power Electronics, vol. 19, No. 4, Jul. 2004. pp. 1130-1139.
UK Intellectual Property Office, Patents Act 1977: Patents Rules Notification of Grant: Patent Serial No. GB2480015, Nov. 29, 2011.
Hou, et al., Application of Adaptive Algorithm of Solar Cell Battery Charger, Apr. 2004.
Stamenic, et al., "Maximum Power Point Tracking for Building Integrated Photovoltaic Ventilation Systems", 2000.
Informal Comments to the International Search Report dated Dec. 3, 2009.
Walker, et al. "PV String Per-Module Maximum Power Point Enabling Converters", School of Information Technology and Electrical Engineering The University of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. CAIRNS, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.
International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Chen, et al., "A New Low-Stress Buck-Boost Converter for Universal-Input PFC Applications", IEEE Applied Power Electronics Converence, Feb. 2001, Colorado Power Electronics Center Publications.
Chen, et al., "Buck-Boost PWM Converters Having Two Independently Controlled Switches", IEEE Power Electronics Specialists Converence, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "PhotoVoltaic DC-DC Module Integrated Converter for Novel Cascaded and Bypass Grid Connection Topologies-Design and Optimisation", 37th IEEE Power Electronics Specialists Converence, Jun. 18-22, 2006, Jeju, Korea.
Geoffrey R. Walker Affidavit re: U.S. Appl. No. 11/950,307. Submitted in an IDS for U.S. Appl. No. 11/950,271 on Mar. 9, 2010.
Geoffrey R. Walker Affidavit re: U.S. Appl. No. 11/950,271. Submitted in an IDS for U.S. Appl. No. 11/950,271 on Mar. 9, 2010.
Matsui, et al., "A New Maximum Photovoltaic Power Tracking Control Scheme Based on Power Equilibrium at DC Link", IEEE, 1999, pp. 804-809.
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
PCT/IB2010/052287 International Search Report and Written Opinion dated Sep. 2, 2010.
UK Intellectual Property office, Combined Search and Examination Report for GB1100450.4 under Sections 17 and 18 (3), Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.

Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.

Sandia Report SAND96-2797 I UC-1290 Unlimited Release, Printed Dec. 1996, "Photovoltaic Power Systems and The National Electrical Code: Suggested Practices", by John Wiles, Southwest Technology Development Instutte New Mexico State University Las Cruces, NM.

United Kingdom Intellectual Property Office, Combined Search and Examination Report Under Sections 17 and 18(3), GB1020862.7, dated Jun. 16, 2011.

QT Technical Application Papers, "ABB Circuit-Breakers for Direct current Applications", ABB SACE S.p.A., An ABB Group Coupany, L.V. Breakers, Via Baioni, 35, 24123 Bergamo—Italy, Tel.: +39 035.395.111—Telefax: +39 035.395.306-433. Sep. 2007.

Woyte, et al., "Mains Monitoring and Protection in a European Context", 17th European Photovoltaic Solar Energy Conference and Exhibition, Munich, Germany, Oct. 22-26, 2001, Achim, Woyte, et al., pp. 1-4.

"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.

Fairchild Semiconductor, Application Note 9016, IGBT Basics 1, by K.S. Oh Feb. 1, 2001.

"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.

Walker, "A DC Circuit Breaker for an Electric Vehicle Battery Pack", Australasian Universities Power Engineering Conference and IEAust Electric Energy Conference, Sep. 26-29, 1999.

Combined Search and Examination Report for GB1018872.0 dated Apr. 15, 2011, 2 pages.

International Search Report and Opinion of International Patent Application PCT/2009/051221, dated Oct. 19, 2009.

International Search Report and Opinion of International Patent Application PCT/2009/051222, dated Oct. 7, 2009.

Communication in EP07874025.5 dated Aug. 17, 2011.

IPRP for PCT/IB2008/055095 dated Jun. 8, 2010, with Written Opinion.

ISR for PCT/IB2008/055095 dated Apr. 30, 2009.

IPRP for PCT/IL2007/001064 dated Mar. 17, 2009, with Written Opinion dated Mar. 25, 2008.

ISR for PCT/IL07/01064 dated Mar. 25, 2008.

IPRP for PCT/IB2007/004584 dated Jun. 10, 2009, with Written Opinion.

IPRP for PCT/IB2007/004586 dated Jun. 10, 2009, with Written Opinion.

IPRP for PCT/IB2007/004591 dated Jul. 13, 2010, with Written Opinion.

IPRP for PCT/IB2007/004610 dated Jun. 10, 2009, with Written Opinion.

IPRP for PCT/IB2007/004643 dated Jun. 10, 2009, with Written Opinion.

Written Opinion for PCT/IB2008/055092 submitted with IPRP dated Jun. 8, 2010.

IPRP for PCT/US2008/085754 dated Jun. 8, 2010, with Written Opinion dated Jan. 21, 2009.

IPRP for PCT/US2008/085755 dated Jun. 8, 2010, with Written Opinion dated Jan. 20, 2009.

IPRP for PCT/IB2009/051221 dated Sep. 28, 2010, with Written Opinion.

IPRP for PCT/IB2009/051222 dated Sep. 28, 2010, with Written Opinion.

IPRP for PCT/IB2009/051831 dated Nov. 9, 2010, with Written Opinion.

IPRP for PCT/US2008/085736 dated Jun. 7, 2011, with Written Opinion.

IPRP for PCT/IB2010/052287 dated Nov. 22, 2011, with Written Opinion.

ISR for PCT/IB2010/052413 dated Sep. 7, 2010.

UK Intellectual Property Office, Application No. GB1109618.7, Patents Act 1977, Examination Report Under Section 18(3), Sep. 16, 2011.

Lijun Gao et al., Parallel-Connected Solar PV System to Address Partial and Rapidly Fluctuating Shadow Conditions, IEEE Transactions on industrial Electronics, vol. 56, No. 5, May 2009.

Extended European Search Report—EP12176089.6—Mailing date: Nov. 8, 2012.

Gwon-Jong Yu et al: "Maximum power point tracking with temperature compensation of photovoltaic for air conditioning system with fuzzy controller", 19960513; 19960513-19960517, May 13, 1996, pp. 1429-1432, XP010208423.

Extended European Search Report—EP12177067.1—Mailing Date: Dec. 7, 2012.

"Study of Energy Storage Capacitor Reduction for Single Phase PWM Rectifier", Ruxi Wang et al., Virginia Polytechnic Institute and State University, Feb. 2009.

"Multilevel Inverters: A Survey of Topologies, Controls, and Applications", José Rodriguez et al., IEEE Transactions on Industrial Electronics, Vol. 49, No. 4, Aug. 2002.

Extended European Search Report—EP 08878650.4—Mailing date: Mar. 28, 2013.

Sergio Busquets-Monge et al., "Multilevel Diode-clamped Converter for Photovoltaic Generators With Independent Voltage Control of Each Solar Array", IEEE Transactions on Industrial Electronics, Vol. 55, No. 7, Jul. 2008.

John Xue, "PV Module Series String Balancing Converters", University of Queensland—School of Infroanrition Technology & Electrical Engineering, Nov. 6, 2002.

Khairy Fathy et al., "A Novel Quasi-Resonant Snubber-Assisted ZCS-PWM DC-DC Converter with High Frequency Link", Journal of Power Electronics, vol. 7, No. 2, Apr. 2007.

Cheng K.W.E., "New Generation of Switched Capacitor Converters", Department of Electrical Engineering, The Hong Kong Polytechnic University, Hung Hom, Hong Kong, Power Electronics Conference, 1998, PESC 98.

Per Karlsson, "Quasi Resonant DC Link Converters—Analysis and Design for a Battery Charger Application", Universitetstryckeriet, Lund University, 1999, ISBN 91-88934-14-4.

Yuang-Shung Lee et al.,"A Novel QR ZCS Switched-Capacitor Bidirectional Converter", IEEE, 2007.

Antti Tolvanen et al., "Seminar on Solar Simulation Standards and Measurement Principles", May 9, 2006 Hawaii.

J.A. Eikelboom and M.J. Jansen, "Characterisation of PV Modules of New Generations—Results of tests and simulations", Jun. 2000.

Yeong-Chau Kuo et al., "Novel Maximum-Power-Point-Tracking Controller for Photovoltaic Energy Conversion System", IEEE Transactions on Industrial Electronics, Vol. 48, No. 3, Jun. 2001.

C. Liu et al., "Advanced Algorithm for MPPT Control of Photovoltaic Systems", Canadian Solar Buildings Conference, Montreal, Aug. 20-24, 2004.

Chihchiang Hua and Chihming Shen, "Study of Maximum Power Tracking Techniques and Control of DC/DC Converters for Photovoltaic Power System", IEEE 1998.

Tore Skjellnes et al., "Load sharing for parallel inverters without communication", Nordic Workshop in Power and Industrial Electronics, Aug. 12-14, 2002.

Giorgio Spiazzi at el., "A New Family of Zero-Current-Switching Variable Frequency dc-dc Converters", IEEE 2000.

Nayar, C.V., M. Ashari and W.W.L Keerthiphala, "A Gridinteractive Photovoltaic Uninterruptible Power Supply System Using Battery Storage and a Back up Diesel Generator", IEEE Transactions on Energy Conversion, vol. 15, No. 3, Sep. 2000, pp. 348-353.

Ph. Strauss et al., "AC coupled PV Hybrid systems and Micro Grids-state of the art and future trends", 3rd World Conference on Photovoltaic Energy Conversion, Osaka, Japan May 11-18, 2003.

Nayar, C.V., abstract, Power Engineering Society Summer Meeting, 2000. IEEE, 2000, pp. 1280-1282 vol. 2.

D. C. Martins et al., "Analysis of Utility Interactive Photovoltaic Generation System using a Single Power Static Inverter", Asian J. Energy Environ., vol. 5, Issue 2, (2004), pp. 115-137.

Soeren Baekhoej Kjaer et al., "A Review of Single-Phase Grid-Connected Inverters for Photovoltaic Modules", IEEE Transactions on Industry Applications, Vol. 41, No. 5, Sep./Oct. 2005.

* cited by examiner

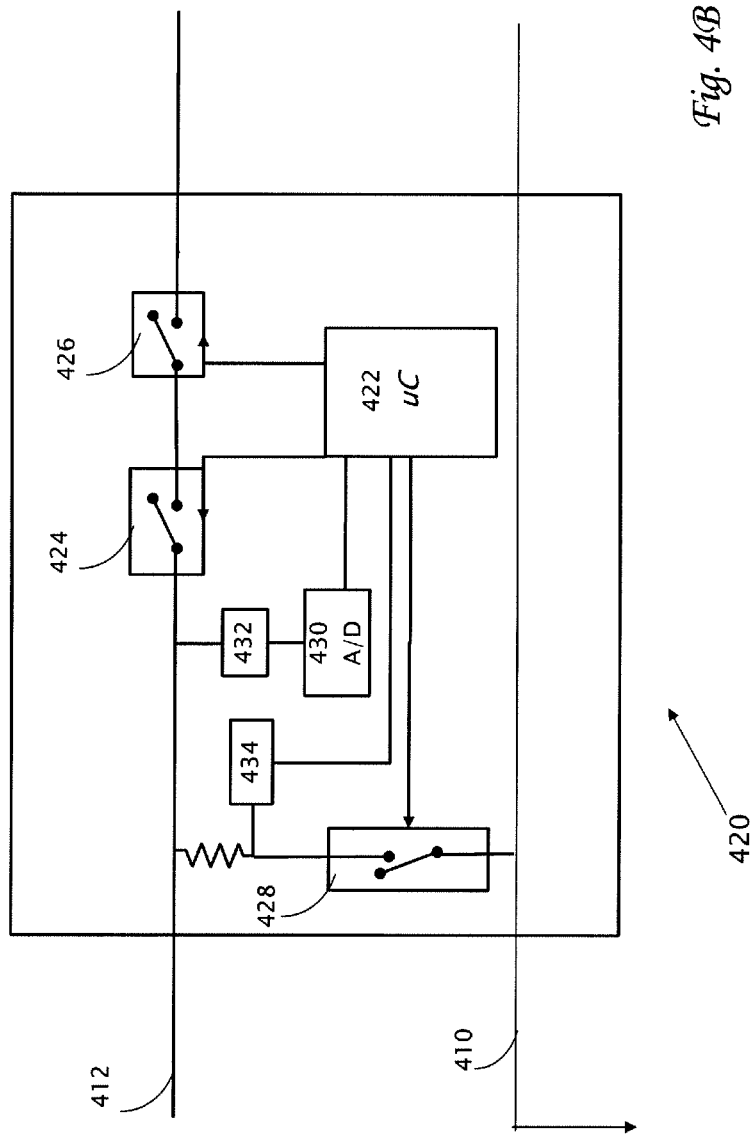

SAFETY MECHANISMS, WAKE UP AND SHUTDOWN METHODS IN DISTRIBUTED POWER INSTALLATIONS

CROSS REFERENCE TO RELATED APPLICATIONS

The present application is a continuation-in-part of co-pending U.S. application Ser. No. 11/950,271, filed Dec. 4, 2007 which claims the benefit of U.S. provisional application 60/868,851, filed Dec. 6, 2006, U.S. provisional application 60/868,962, filed Dec. 7, 2006, U.S. provisional application 60/868,893, filed Dec. 6, 2006, U.S. provisional application 60/908,095, filed Mar. 26, 2007, and U.S. provisional application 60/916,815, filed May 9, 2007. U.S. application Ser. No. 11/950,271 is included herein by reference for all purposes as if entirely set forth herein.

The present application benefits from U.S. provisional application 60/992,589 filed Dec. 5, 2007 by the present inventors, the disclosure of which is included herein by reference for all purposes as if entirely set forth herein.

FIELD AND BACKGROUND

The present invention relates to distributed power systems and, more particularly, wake-up and shutdown algorithms for the photovoltaic distributed power systems.

Utility networks provide an electrical power system to utility customers. The distribution of electric power from utility companies to customers utilizes a network of utility lines connected in a grid-like fashion, referred to as an electrical grid. The electrical grid may consist of many independent energy sources energizing the grid in addition to utility companies energizing the grid, with each independent energy source being referred to as a distributed power (DP) generation system. The modern utility network includes the utility power source, consumer loads, and the distributed power generation systems which also supply electrical power to the network. The number and types of distributed power generation systems is growing rapidly and can include photovoltaics, wind, hydro, fuel cells, storage systems such as battery, super-conducting flywheel, and capacitor types, and mechanical devices including conventional and variable speed diesel engines, Stirling engines, gas turbines, and micro-turbines. These distributed power generation systems are connected to the utility network such that they operate in parallel with the utility power sources.

A conventional installation of a solar distributed power system 10, including multiple solar panels 101, is illustrated in FIG. 1. Since the voltage provided by each individual solar panel 101 is low, several panels 101 are connected in series to form a string 103 of panels 101. For a large installation, when higher current is required, several strings 103 may be connected in parallel to form overall system 10. The interconnected solar panels 101 are mounted outdoors, and connected to a maximum power point tracking (MPPT) module 107 and then to an inverter 104. MPPT 107 is typically implemented as part of inverter 104 as shown in FIG. 1. The harvested power from DC sources 101 is delivered to inverter 104, which converts the direct-current (DC) into alternating-current (AC) having a desired voltage and frequency, which is usually 110V or 220V at 60 Hz, or 220 V at 50 Hz. The AC current from inverter 104 may then be used for operating electric appliances or fed to the power grid.

As noted above, each solar panel 101 supplies relatively very low voltage and current. A problem facing the solar array designer is to produce a standard AC current at 120V or 220V root-mean-square (RMS) from a combination of the low voltages of the solar panels. The delivery of high power from a low voltage requires very high currents, which cause large conduction losses on the order of the second power of the current $i^2$. Furthermore, a power inverter, such as inverter 104, which is used to convert DC current to AC current, is most efficient when its input voltage is slightly higher than its output RMS voltage multiplied by the square root of 2 (which is the peak voltage). Hence, in many applications, the power sources, such as solar panels 101, are combined in order to reach the correct voltage or current. A large number of panels 101 are connected into a string 103 and strings 103 are connected in parallel to power inverter 104. Panels 101 are connected in series in order to reach the minimal voltage required for inverter 104. Multiple strings 103 are connected in parallel into an array to supply higher current, so as to enable higher power output.

FIG. 1B illustrates one serial string 103 of DC sources, e.g., solar panels 101a-101d, connected to MPPT circuit 107 and inverter 104. The current versus voltage (IV) characteristics is plotted (110a-110d) to the left of each DC source 101. For each DC power source 101, the current decreases as the output voltage increases. At some voltage value, the current goes to zero, and in some applications the voltage value may assume a negative value, meaning that the source becomes a sink. Bypass diodes (not shown) are used to prevent the source from becoming a sink. The power output of each source 101, which is equal to the product of current and voltage ($P=i*V$), varies depending on the voltage drawn from the source. At a certain current and voltage, close to the falling off point of the current, the power reaches its maximum. It is desirable to operate a power generating cell at this maximum power point (MPP). The purpose of the MPPT is to find this point and operate the system at this point so as to draw the maximum power from the sources.

In a typical, conventional solar panel array, different algorithms and techniques are used to optimize the integrated power output of system 10 using MPPT module 107. MPPT module 107 receives the current extracted from all of solar panels 101 together and tracks the maximum power point for this current to provide the maximum average power such that if more current is extracted, the average voltage from the panels starts to drop, thus lowering the harvested power. MPPT module 107 maintains a current that yields the maximum average power from system 10.

However, since power sources 101a-101d are connected in series to single MPPT 107, MPPT 107 selects a maximum power point which is some average of the maximum power points of the individual serially connected sources 101. In practice, it is very likely that MPPT 107 would operate at an I-V point that is optimum for only a few or none of sources 101. In the example of FIG. 1B, the selected point is the maximum power point for source 101b, but is off the maximum power point for sources 101a, 101c and 101d. Consequently, the arrangement is not operated at best achievable efficiency.

The present applicant has disclosed in co-pending U.S. application Ser. No. 11/950,271 entitled "Distributed Power Harvesting Systems Using DC Power Sources", the use of an electrical power converter, e.g. DC-to-DC converter, attached to the output of each power source, e.g. photovoltaic panel. The electrical power converter converts input power to output power by monitoring and controlling the input power at a maximum power level.

The term "signaling" or "signaling mechanism" as used herein refers to either a signal modulated on an electromagnetic carrier signal or a simple unmodulated signal such as an on/off signal "keep alive" signal or "dry contact" signal. For a modulated signal, the modulation method may be by any such method known in the art by way of example, frequency modulation (FM) transmission, amplitude modulation (AM), FSK (frequency shift keying) modulation, PSK (phase shift keying) modulation, various QAM (Quadrature amplitude modulation) constellations, or any other method of modulation.

The term "power module" as used herein includes power converters such as a DC-DC power converter but also includes modules adapted to control the power passing through the module or a portion of the power, whether by switching or other means.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to an aspect of the present invention, there is provided a distributed power system including a DC power source and a power module. The power module includes an input coupled respectively to the DC power source and an output. An inverter is coupled to the output. The inverter converts power input from the output of the power module to output power. A signaling mechanism between the inverter and the power module is adapted for controlling operation of the power module. During operation of the distributed power system, in some embodiments, the signaling mechanism may superimpose a signal on the output of the power module. The signaling mechanism may include a switch integrated with the inverter, the switch modulating the signal onto the output of the power module. A receiver integrated with the power modules receives the signal from the inverter. Alternatively a detection mechanism in the power module detects a signal at the frequency of the electrical grid. Alternatively, a signal from the electrical grid is detected in the output of the power module at a higher frequency up-converted from the frequency of the electrical grid. Alternatively, a detection mechanism in the power module detects a switching frequency of the inverter. The power modules are may be configured for operation in a safety mode, and during the safety mode, the power at the output of the power module, the voltage across the output of the power module, and/or the current flowing through it, are limited so as not to endanger personnel. The power module may include a detection mechanism wherein during operation of the distributed power system, the detection mechanism detects a signal from the inverter. Based on the signal, the operation of the power module is varied from the safety mode of operation to a normal mode of operation for converting power of the DC power source from the input to the output of the power module.

According to another aspect of the present invention there is provided a method for operating a distributed power system. The system includes a DC power source and a power module. The power module includes an input coupled to the DC power source. The power module includes an output. An inverter is coupled to the output of the power module. The inverter converts a power output from the power module to an output power. The method includes operating the power modules in a safety mode by limiting the power output from the power module. The safety mode is characterized by having less than a predetermined amount (e.g. ten milliamperes) of current flow and/or less than a predetermined amount (e.g. 2 Volts) through the output of the power module. A signal from the inverter is preferably monitored and upon detecting the signal from the inverter, the power input to the inverter is increased by operating the power module in a normal mode of operation for converting power of the DC power source from the input to the output of the power module. Upon detecting the signal and prior to the operation of the power module in the normal mode of operation, the voltage of the output of the power module is preferably ramped up slowly. The normal mode of operation of the power module may include controlling a maximum peak power at the input coupled to the DC power sources.

The foregoing and/or other aspects will become apparent from the following detailed description when considered in conjunction with the accompanying drawing figures.

BRIEF DESCRIPTION OF THE DRAWINGS

The accompanying drawings, which are incorporated in and constitute a part of this specification, exemplify embodiments of the present invention and, together with the description, serve to explain and illustrate principles of the invention. The drawings are intended to illustrate various features of the illustrated embodiments in a diagrammatic manner. The drawings are not intended to depict every feature of actual embodiments nor relative dimensions of the depicted elements, and are not necessarily drawn to scale.

The invention is herein described, by way of example only, with reference to the accompanying drawings, wherein:

FIG. 1B illustrates current versus voltage characteristic curves for one serial string the DC power sources of FIG. 1;

FIG. 2A is a simplified block diagram of a DC-to-DC converter, including a feature of the present invention;

FIG. 4B is a simplified block diagram illustrating in more detail, a signaling mechanism attached to a conventional inverter, according to embodiments of the present invention;

DETAILED DESCRIPTION

Figure 1:
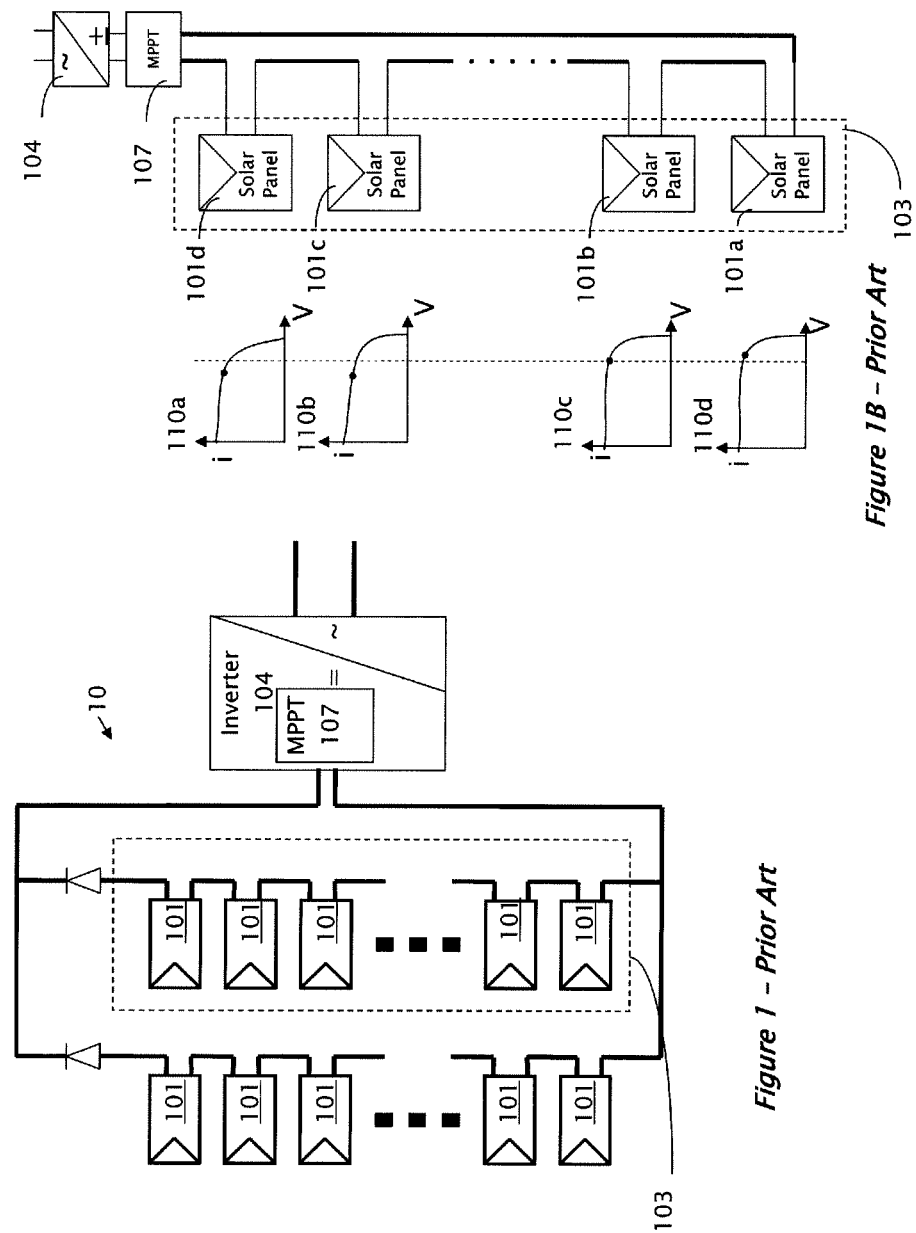
FIG. 1 is a block diagram of a conventional power harvesting system using photovoltaic panels as DC power sources.

Reference will now be made in detail to embodiments of the present invention, examples of which are illustrated in the accompanying drawings, wherein like reference numerals refer to the like elements throughout. The embodiments are described below to explain the present invention by referring to the figures.

It should be noted, that although the discussion herein relates primarily to wake-up and shutdown methods in photovoltaic systems and more particularly to those systems previously disclosed in U.S. application Ser. No. 11/950,271, the present invention may, by non-limiting example, alternatively be configured as well using conventional photovoltaic distributed power systems and other distributed power systems including (but not limited to) wind turbines, hydroturbines, fuel cells, storage systems such as battery, super-conducting flywheel, and capacitors, and mechanical devices including conventional and variable speed diesel engines, Stirling engines, gas turbines, and micro-turbines.

By way of introduction, it is important to note that aspects of the present invention have important safety benefits. While installing or performing maintenance on photovoltaic systems according to certain aspects of the present invention, installers are protected from danger of shock or electrocution since systems according to embodiments of the present invention do not output potentially dangerous high voltage and/or currents when an operational inverter is not connected during installation and maintenance procedures.

Before explaining embodiments of the invention in detail, it is to be understood that the invention is not limited in its application to the details of design and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Figure 2:
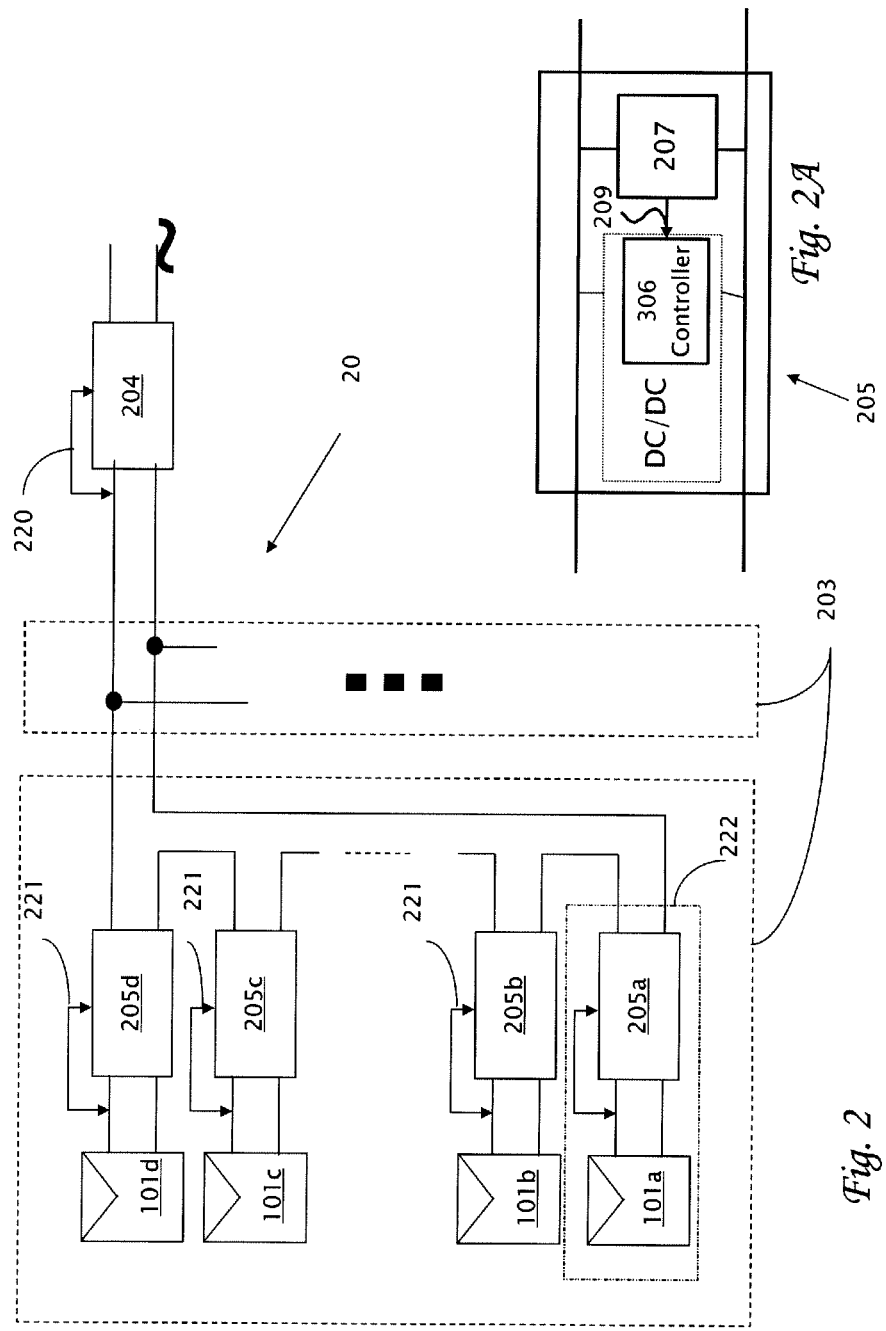
FIG. 2 is a simplified block diagram illustrating a distributed power harvesting circuit, based on the disclosure in U.S. application Ser. No. 11/950,271, according to an aspect of the present invention.

Reference is now made to FIG. 2 which illustrates a distributed power harvesting circuit 20, based on the disclosure in U.S. application Ser. No. 11/950,271. Circuit 20 enables connection of multiple distributed power sources, for example solar panels 101a-101d, to a single power supply. Series string 203 of solar panels 101 may be coupled to an inverter 204 or multiple connected strings 203 of solar panels 101 may be connected to a single inverter 204. In configuration 20, each solar panel 101a-101d is connected individually to a separate power converter circuit or a module 205a-205d. Each solar panel 101 together with its associated power converter circuit 205 forms a power generating element 222. (Only one such power generating element 222 is marked in FIG. 2.) Each converter 205a-205d adapts optimally to the power characteristics of the connected solar panel 101a-101d and transfers the power efficiently from input to output of converter 205. Converters 205a-205d are typically microprocessor controlled switching converters, e.g. buck converters, boost converters, buck/boost converters, flyback or forward converters, etc. The converters 205a-205d may also contain a number of component converters, for example a serial connection of a buck and a boost converter. Each converter 205a-205d includes a control loop 221, e.g. MPPT loop that receives a feedback signal, not from the converter's output current or voltage, but rather from the converter's input coming from solar panel 101. The MPPT loop of converter 205 locks the input voltage and current from each solar panel 101a-101d at its optimal power point, by varying one or more duty cycles of the switching conversion typically by pulse width modulation (PWM) in such a way that maximum power is extracted from each attached panel 101a-101d. The controller of converter 205 dynamically tracks the maximum power point at the converter input. Feedback loop 221 is closed on the input power in order to track maximum input power rather than closing a feedback loop on the output voltage as performed by conventional DC-to-DC voltage converters.

As a result of having a separate MPPT circuit in each converter 205a-205d, and consequently for each solar panel 101a-101d, each string 203 may have a different number or different specification, size and/or model of panels 101a-101d connected in series. System 20 of FIG. 2 continuously performs MPPT on the output of each solar panel 101a-101d to react to changes in temperature, solar radiance, shading or other performance factors that effect one or more of solar panels 101a-101d. As a result, the MPPT circuit within the converters 205a-205d harvests the maximum possible power from each panel 101a-101d and transfers this power as output regardless of the parameters effecting other solar panels 101a-101d.

The outputs of converters 205a-205d are series connected into a single DC output that forms the input to inverter 204. Inverter 204 converts the series connected DC output of converters 205a-205d into an AC power supply. Inverter 204, regulates the voltage at the input of inverter 204. In this example, an independent control loop 220 holds the voltage input to inverter 204 at a set value, say 400 volts. The current at the input of inverter 204 is typically fixed by the power available and generated by photovoltaic panels 101.

According to a feature of the present invention, information regarding wakeup or shut-down may be conveyed from inverter 204 to converters 205. The information may be transmitted using any of the methods well known to those experienced in the art. According to certain embodiments, a modulation method may be used, by way of example, frequency modulation (FM) transmission, amplitude modulation (AM), FSK (frequency shift keying) modulation, PSK (phase shift keying) modulation, various QAM (Quadrature amplitude modulation) constellations, or any other method of modulation. Alternatively, inverter 204, while converting power from its input to its output, actively creates a frequency ripple in serial string 203. During normal operation, the 100 Hz (or 120 Hz in USA) ripple is detectable in serial string 203 since the capacitors of inverter 204 do not entirely block the alternating current (AC), and an additional signaling mechanism is not required to produce the 100/120 Hz signal in serial string 203. Alternatively or in addition, one or more switching frequencies of inverter 204, typically 16 KHz or 32 KHz may be detectable as leakage or provided intentionally to serial string 203.

Reference is now made to FIG. 2A which illustrates a feature of the present invention. In FIG. 2A, converter 205 is shown in more detail. Integrated with power converter 205 is a detector/receiver 207, according to a feature of the present invention which is configured to receive, optionally amplify and detect the signal, e.g. at 100/120 Hz originating in inverter 204.

Controller 306 preferably either polls a signal input 209 from receiver/detector 207 or uses signal input 209 as an interrupt so that only when detector/receiver 207 detects the 100/120 Hz signal, is module 205 in a normal operating mode converting power from its input to its output. Receiver 207 is alternatively configured to detect the 16/32 KHz inverter switching frequency and provides an enabling signal to controller on signal input 209 while inverter 204 is operating.

Figure 3:
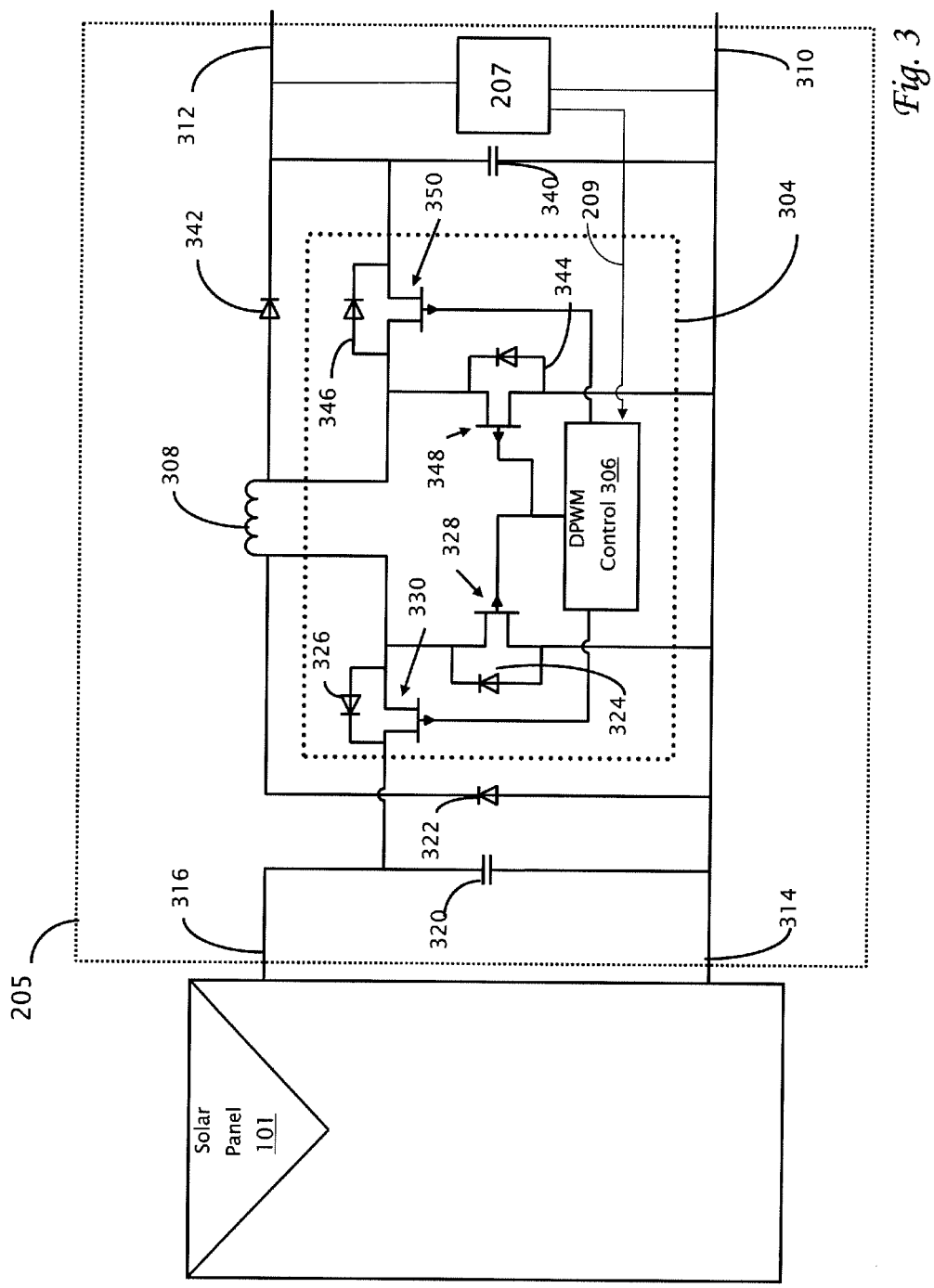
FIG. 3 illustrates an exemplary DC-to-DC converter, is a simplified block diagram illustrating in more detail.

Reference is now made to FIG. 3 which illustrates an exemplary DC-to-DC converter 205, according to a feature of the present invention. DC-to-DC converters are used to either step down or step up a DC voltage input to a higher or a lower DC voltage output, depending on the requirements of the output circuit. However, in the embodiment of FIG. 3 the DC-DC converter 205 is used as a power converter, i.e., transferring the input power to output power, the input voltage varying according to the MPPT at the input, while the output current is dictated by the constant input voltage to inverter 104, 204. That is, the input voltage and current may vary at any time and the output voltage and current may vary at any time, depending on the operating condition of DC power sources 101.

Converter 205 is connected to a corresponding DC power source 101 at input terminals 314 and 316. The converted power of the DC power source 101 is output to the circuit through output terminals 310, 312. Between the input terminals 314, 316 and the output terminals 310, 312, the converter circuit includes input and output capacitors 320, 340, backflow prevention diodes 322, 342 and a power conversion circuit including a controller 306 and an inductor 308.

Diode 342 is in series with output 312 with a polarity such that current does not backflow into the converter 205. Diode 322 is coupled between the positive output lead 312 through inductor 308 which acts a short for DC current and the negative input lead 314 with such polarity to prevent a current from the output 312 to backflow into solar panel 101.

A potential difference exists between wires 314 and 316 due to the electron-hole pairs produced in the solar cells of panel 101. Converter 205 maintains maximum power output by extracting current from the solar panel 101 at its peak power point by continuously monitoring the current and voltage provided by panel 101 and using a maximum power point tracking algorithm. Controller 306 includes an MPPT circuit or algorithm for performing the peak power tracking. Peak power tracking and pulse width modulation (PWM) are performed together to achieve the desired input voltage and current. The MPPT in controller 306 may be any conventional MPPT, such as, e.g., perturb and observe (P&O), incremental conductance, etc. However, notably the MPPT is performed on panel 101 directly, i.e., at the input to converter 205, rather than at the output of converter 205. The generated power is then transferred to the output terminals 310 and 312. The outputs of multiple converters 205 may be connected in series, such that the positive lead 312 of one converter 205 is connected to the negative lead 310 of the next converter 205.

In FIG. 3, converter 205 is shown as a buck plus boost converter. The term "buck plus boost" as used herein is a buck converter directly followed by a boost converter as shown in FIG. 3, which may also appear in the literature as "cascaded buck-boost converter". If the voltage is to be lowered, the boost portion is substantially shorted. If the voltage is to be raised, the buck portion is substantially shorted. The term "buck plus boost" differs from buck/boost topology which is a classic topology that may be used when voltage is to be raised or lowered, and sometimes appears in the literature as "cascaded buck-boost". The efficiency of "buck/boost" topology is inherently lower then a buck or a boost. Additionally, for given requirements, a buck-boost converter will need bigger passive components then a buck plus boost converter in order to function. Therefore, the buck plus boost topology of FIG. 3 has a higher efficiency than the buck/boost topology. However, the circuit of FIG. 3 continuously decides whether it is bucking or boosting. In some situations when the desired output voltage is similar to the input voltage, then both the buck and boost portions may be operational.

The controller 306 may include a pulse width modulator, PWM, or a digital pulse width modulator, DPWM, to be used with the buck and boost converter circuits. Controller 306 controls both the buck converter and the boost converter and determines whether a buck or a boost operation is to be performed. In some circumstances both the buck and boost portions may operate together. That is, the input voltage and current are selected independently of the selection of output current and voltage. Moreover, the selection of either input or output values may change at any given moment depending on the operation of the DC power sources. Therefore, in the embodiment of FIG. 3, converter 205 is constructed so that at any given time a selected value of input voltage and current may be up converted or down converted depending on the output requirement.

In one implementation, an integrated circuit (IC) 304 may be used that incorporates some of the functionality of converter 205. IC 304 is optionally a single ASIC able to withstand harsh temperature extremes present in outdoor solar installations. ASIC 304 may be designed for a high mean time between failures (MTBF) of more than 25 years. However, a discrete solution using multiple integrated circuits may also be used in a similar manner. In the exemplary embodiment shown in FIG. 3, the buck plus boost portion of the converter 305 is implemented as the IC 304. Practical considerations may lead to other segmentations of the system. For example, in one aspect of the invention, the IC 304 may include two ICs, one analog IC which handles the high currents and voltages in the system, and one simple low-voltage digital IC which includes the control logic. The analog IC may be implemented using power FETs which may alternatively be implemented in discrete components, FET drivers, A/Ds, and the like. The digital IC may form controller 306.

In the exemplary circuit 205 shown, the buck converter includes input capacitor 320, transistors 328 and 330, diode 322 positioned in parallel to transistor 328, and inductor 308. Transistors 328, 330 each have a parasitic body diode 324, 326. The boost converter includes inductor 308, which is shared with the buck converter, transistors 348 and 350 a diode 342 positioned in parallel to transistor 350, and output capacitor 340. Transistors 348, 350 each have a parasitic body diode 344, 346.

System 20 includes converters 205 which are connected in series and carry the current from string 203. If a failure in one of the serially connected converters 205 causes an open circuit in failed converter 205, current ceases to flow through the entire string 203 of converters 205, thereby causing system 20 to stop functioning. Aspects of the present invention provide a converter circuit 205 in which electrical components have one or more bypass routes associated with them that carry the current in case of an electrical component failing within one of converters 205. For example, each switching transistor of either the buck or the boost portion of the converter has its own diode bypass. Also, upon failure of inductor 308, the current bypasses the failed inductor 308 through parasitic diodes 344,346.

In FIG. 3, detector/receiver block 207 is shown which is configured to provide an enable signal 209 to microcontroller 306 when the communications signal originating in inverter 104,204 is detected.

Figures 4, 4A:
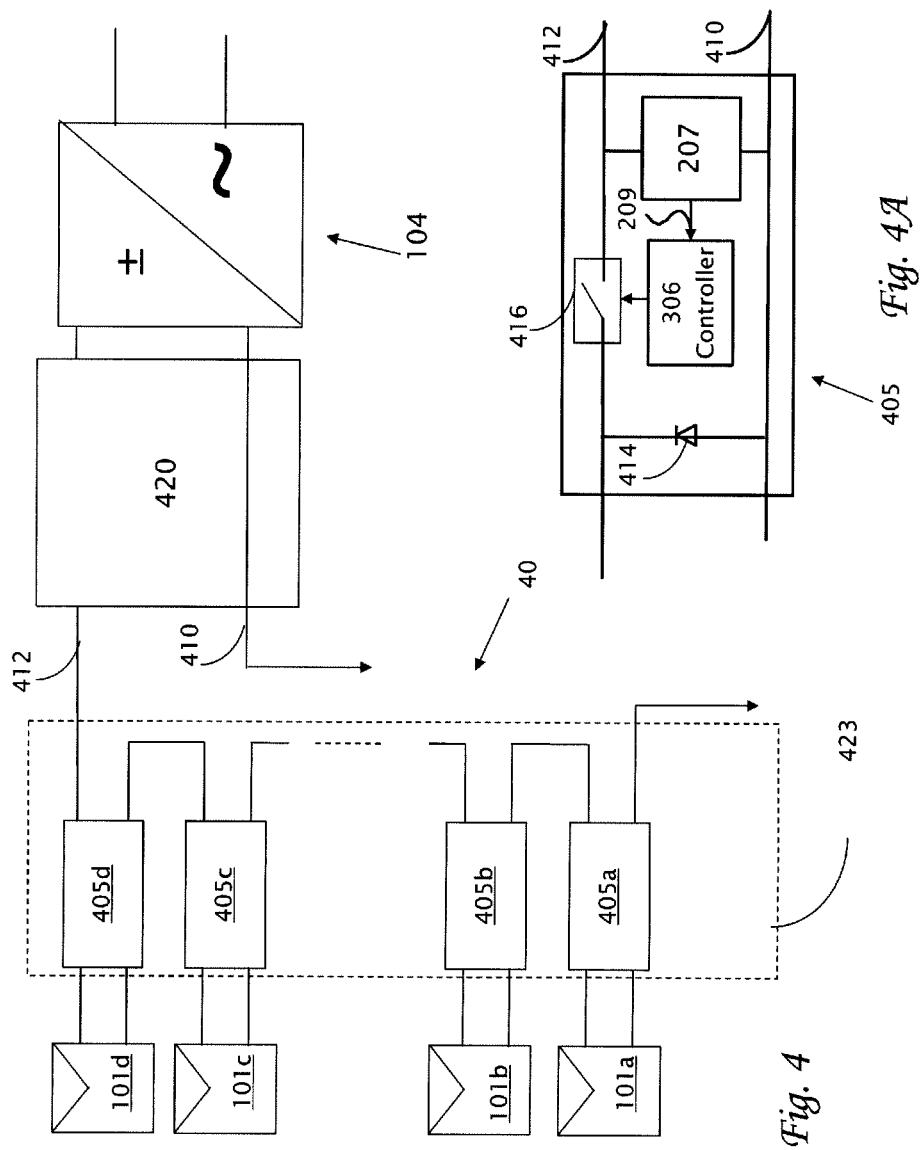
FIG. 4 is a simplified block diagram of another exemplary system, according to an embodiment of the present invention.
FIG. 4A is a simplified block diagram illustrating in more detail, a power module according to the embodiment of FIG. 4.

Reference in now made to FIGS. 4, which illustrate system 40, according to an embodiment of the present invention. For simplicity, a single string 423 is shown of distributed power sources, e.g. solar panels 101a-101d connected to respective power modules 405a-d. Serial string 423 is input to conventional inverter 104 through wires 412 and 410. The output of inverter 104 is connected to and supplies electrical power to the electrical grid. At the input of inverter 104, is connected a signaling mechanism 420 which superimposes a signal on serial string 423 through wires 412 and 410 when inverter 104 is converting power to the grid.

Reference is now also made to FIG. 4B which illustrates in more detail signaling mechanism 420. Signaling mechanism 420 includes a relay 428 which is normally open and controlled by a microcontroller 422. Relay 428 is switched at a given rate, e.g. 100 Hz, and the signal is superimposed by action of relay 428 onto serial string 423 over wires 410 and 412. Microcontroller 422 typically provides the control of the signal, e.g. 100 Hz, during normal operation of distributed power system 40. Microcontroller 422 is typically connected to one or more sensors in order to monitor the operation of inverter 104. In the example of FIG. 4B, microcontroller 422 monitors over-voltage of the input DC voltage to inverter 104. The example shown in FIG. 4B includes an input DC voltage tap 432 connected to an analog to digital converter (A/D) 430, the output of which is provided to microcontroller 422. The tap 432 may be, e.g., a Hall-effect sensors, series connected resistor across which the voltage drop is measured, etc. In one embodiment, an over-voltage condition as measured by microcontroller 422, results in microcontroller 422 stopping the signaling through relay 428 and/or opening one or more protective relays 424, 426 in series with the input DC voltage to inverter 104. Note that one switch 424 or 426 may be enough for performing the required action, and two switches in series are shown solely for the purpose of illustration that double protection might be required by some regulatory bodies. A power management block 434 taps voltage for powering microcontroller 422 and any other active electronics components (not shown) in block 420.

Reference is now made to FIG. 4A which illustrates in more detail certain aspects of power module 405. Integrated with power module 405 is detector/receiver 207 which is configured to receive, optionally amplify and detect the signal, e.g. at 100 Hz, produced by signal mechanism 420. Controller 306 preferably either polls signal input 209 or uses signal input 209 as an interrupt so that only when detector/receiver 207 detects the 100Hz signal, is module 405 operating in a normal operating mode. Power module 405 is shown to include a bypass diode 414. Optionally, power module 405 may include a conventional DC/DC switching converter with a control loop based on output power. Power module 405 includes at least one switch 416 controlled by controller 306 which functions to stop normal operation of power from the input of module 405 to the output of 405 when signal input 209 is absent indicating that inverter 104 is not transferring power to the electrical grid.

Figure 5:
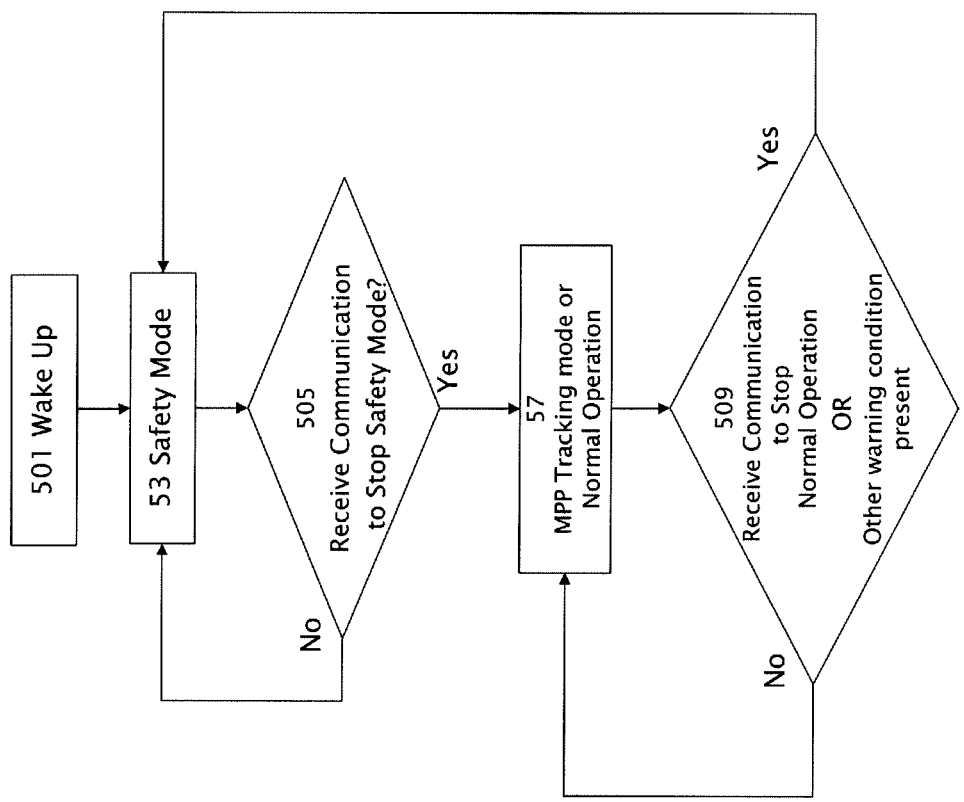
FIG. 5 is a simplified flow diagram illustrating a method for wake-up and shutdown of a power harvesting system with a safety mode, according to a feature of the present invention.

Reference is now made to FIG. 5 which illustrates a simplified method for safe operation of system 40, according to an aspect of the present invention. In step 501, active control circuits, e.g. microcontroller 306, are turned on. Module 205, 405 begins operation (step 53) in a safety mode. In safety mode, output current and/or voltage from module 405 is limited, for instance output voltage is limited to 2 volts and output current is limited to 10 mA so that a person can touch the wires of serial string 203, 423 without any danger of electrocution.

Controller 306 maintains safety mode operation (step 53) until a communications signal, e.g. 100 Hz, is received (decision box 505) by receiver/detector 207 from inverter 204 or signaling block 420. When the communications signal is received (decision block 505) indicating inverter 104 or 204 is connected and converting power, safety mode (step 53) of operation ends. When the communications signal is received (decision block 505), module 405 preferably enters a normal operation mode (step 57), typically with maximum power point tracking. The normal operation of transferring power is maintained as long as the communications signal, e.g. 100 Hz is received from inverter 204 or signal mechanism 420, and no other warning condition is present. If the communications signal is not detected, or another warning condition is present, the normal mode (step 57) is typically ended and power conversion of modules 405 is typically turned off. If in decision box 509, the communications signal is not detected, or another warning condition is present, the normal mode (step 57) is typically ended and power conversion of modules 405 is typically turned off.

Figure 5A:
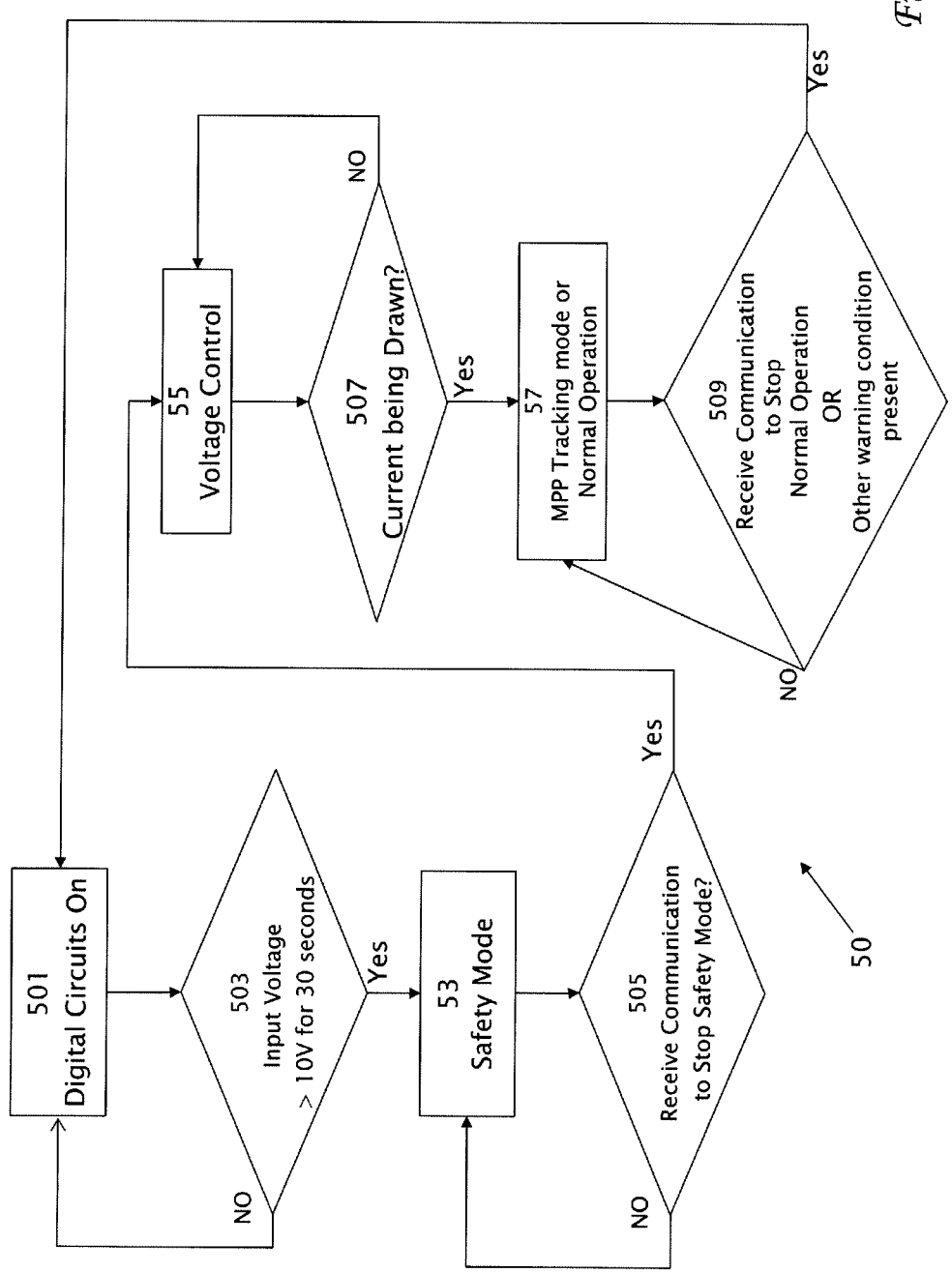
FIG. 5A is a flow diagram illustrating methods for wake-up and shutdown of a power harvesting system, according to embodiments of the present invention, the flow diagram including method steps performed by the power converters/modules.

Reference is now made to FIG. 5A, which illustrates a method 50 for wake-up and shutdown of module 405, according to embodiments of the present invention. Method 50 is applicable to both systems 20 and 40. In step 501, active control circuits, e.g. microcontroller 306, are turned on. Active control circuits are typically turned on (step 501) in the early morning when there is sufficient light to power the active control circuits typically with voltage of DC voltage source 101 reaching three volts. In decision block 503, when voltage output—or power output—from DC voltage source 101 is sufficiently high and stable (e.g. voltage input to module 405 is ten volts for a period of 30 seconds), then module 205,405 begins operation (step 53) in a safety mode. In safety mode, output current and/or voltage from module 405 is limited, for instance output voltage is limited to 2 volts and output current is limited to 10 mA so that a person can touch the wires of serial string 203,423 without any danger of electrocution. Note also, that in this case even if 25 modules are connected in series, the maximum output voltage of the string doesn't exceed 50V—which means the string voltage is still safe. Referring back to FIG. 3, safety mode may be achieved by controller 306 in module 405 by turning on FET 330 and turning off FETS 328, 348, and 350. Output wire 412 is held close to zero volts. Alternatively, the controller 306 may alternate the switches (e.g. switches 324 & 326 of buck converter) at a low duty-cycle in order to maintain a low output voltage.

Referring back to FIG. 5A, controller 306 maintains safety mode operation (step 53) until a communications signal, e.g. 100 Hz, is received by receiver/detector 207 from inverter 204 or signaling block 420. When the communications signal is received (decision block 505) indicating inverter 104 or 204 is connected and converting power, safety mode (step 53) of operation ends. When the communications signal is received (decision block 505), module 405 preferably enters a voltage control mode (step 55) and voltage output between wires 412,410 is slowly ramped up. Voltage continues to ramp up, typically as high as +60V until module 205,405 detects that current is being drawn (step 507). When sufficient current is drawn (step 507), module 205, 405 begins normal operation, (step 57) e.g. for module 205, the normal mode is the maximum power point (MPP) tracking mode of converting DC power from its input to its output by maintain maximum power at its input. The normal operation of transferring power is maintained as long as the communications signal, e.g. 100 Hz is received from inverter 204 or signal mechanism 420, and no other warning condition is present. If the communications signal is not detected, or another warning condition is present, the normal mode (step 57) is typically ended and power conversion of modules 405 is typically turned off. Exemplary warning conditions in decision box 509, which cause module 205,405 to end normal mode (step 57) and to stop transferring power to its output include: (i) input voltage less than predetermined value, e.g. about 10 volts for 5 seconds, (ii) rapid change in output voltage, for instance greater than 20% in 100 milliseconds, (iii) reception of signal requesting to stop producing power, (iv) not receiving a signal to produce power (in the case where recurring "allow production" signals are required for the converter to function), or (v) output exceeds over voltage threshold caused for instance when multiple modules 205 in string 203 are converting power (step 57) and one of modules 205 of string 203 shuts down, then the other modules 205 of string 203 have a raise of output voltage.

Figure 6:
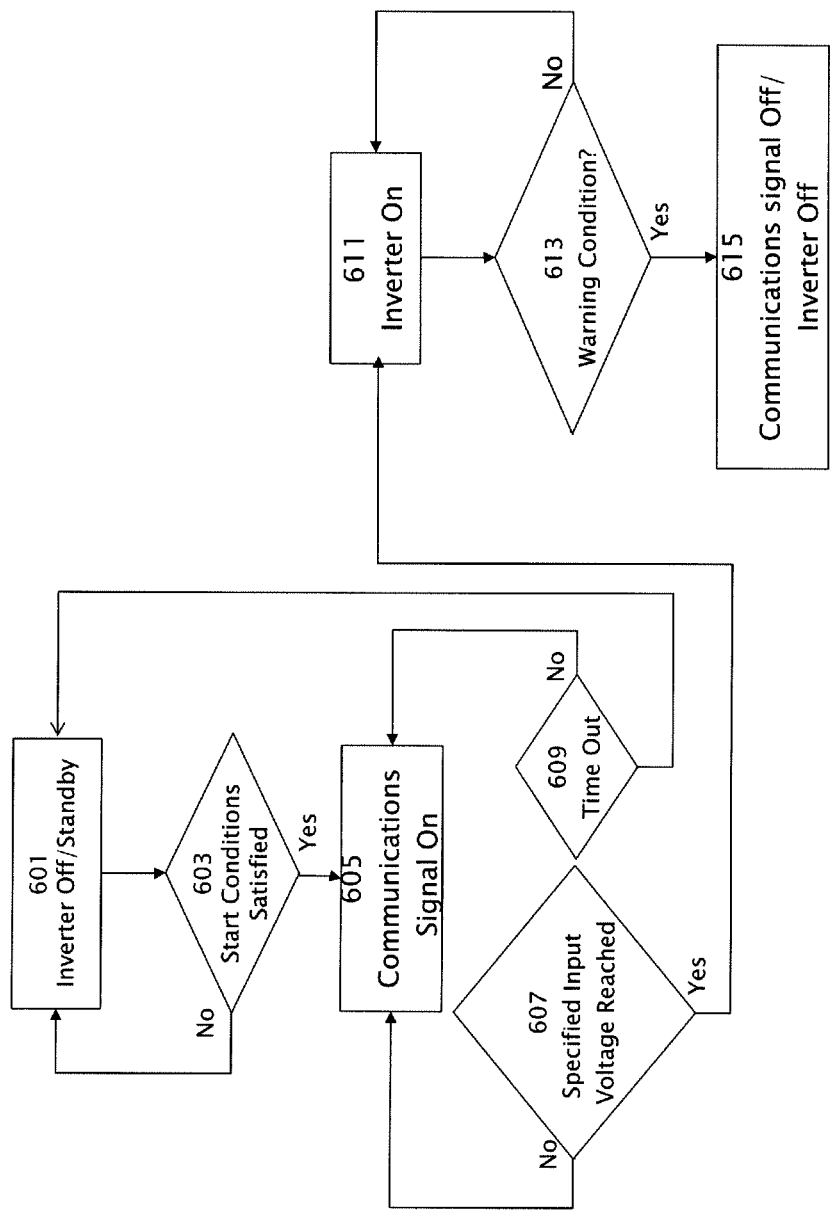
FIG. 6 is another flow diagram illustrating methods for wake-up and shutdown of a power harvesting system, according to embodiments of the present invention, the flow diagram including method steps performed by the inverter of FIG. 2 or signaling block of FIG. 4B.

Reference is now made to FIG. 6, which illustrates a method 60 performed by inverter 204 or signaling block 420 attached at the input of inverter 104. In step 601, inverter 104 is off or inverter 204 is on standby, and not converting power to its output. In decision box 603, start conditions for turning on inverter 104,204 are determined. Typically, as a safety requirement, inverter 104 delays operation (converting power to its output) until after at least 5 minutes of connection to a functioning AC-grid at its output. This safety requirement may be achieved using microcontroller 422 and at least one of relays 424 and 426 in signaling block 420. In inverter 204, a minimum voltage is required at the input to inverter 204 (e.g. if the safety output voltage of each module is 2V, and the minimal-length string allowed contains 5 modules, the inverter will wait until at least 10V are present at its DC input) and only thereafter does inverter 204 begin to charge its input, typically to a specified standard input of 400V.

In step 605, communications signal, e.g. 100 Hz, is superimposed on serial string 203,423 either from signaling mechanism 420 or from inverter 204 for instance when at least a 50 Watt load is attached to the output of inverter 204. In decision box 607, when the specified input voltage is reached, e.g. 400V for inverter 204, inverter 204 is turned on or inverter 104 is attached to serial string 423 by mechanism 420. In decision box 609, if a time out occurs before the minimum specified input voltage is reached of inverter 204, 404 then inverter is returned to the off or standby state (step 601). Otherwise inverter 204,404 is connected or turned on in step 611. Inverter 204, 404 remains on and connected unless a warning condition (decision box 613) occurs. Possible warning conditions include, (i) disconnection from the electrical grid, (ii) electrical grid stops producing power (islanding), (iii) less than 50 Watts transferred in the last minute, (iv) input voltage to inverter 204,404 is over the maximum limit, and (v) input power is over the maximum limit. If a warning condition occurs (decision box 613) communications signal is turned off (step 615) for inverter 404 or inverter 204 is turned off or put into standby.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the server arts. It is intended that the specification and examples be considered as exemplary only, with a true scope and spirit of the invention being indicated by the following claims.

While the invention has been described with respect to a limited number of embodiments, it will be appreciated that many variations, modifications and other applications of the invention may be made.

The invention claimed is:

1. An apparatus comprising:
 a DC-DC converter, wherein said DC-DC converter includes an input configured to couple to a DC power source, and wherein said DC-DC converter includes an output;
 an inverter coupled to said output of said DC-DC converter, said inverter configured to convert power received from said output of said DC-DC converter; and
 a signaling mechanism circuit between said inverter and said DC-DC converter, wherein said signaling mechanism circuit is adapted for controlling operation of said DC-DC converter, and wherein during operation of the apparatus, said signaling mechanism circuit superimposes a signal on said output of said DC-DC converter.

2. The apparatus according to claim 1, further comprising:
 a receiver integrated with said DC-DC converter, said receiver adapted for receiving said signal on said output of said DC-DC converter from said inverter.

3. The apparatus according to claim 1, wherein said DC-DC converter is adapted for operation in a safety mode, and during said safety mode, said power received by the inverter from said output of said DC-DC converter is limited.

4. The apparatus according to claim 3, wherein said DC-DC converter includes a detector, wherein during operation of the apparatus, said detector detects the signal superimposed by said signaling mechanism circuit and, based on said superimposed signal, said operation of said DC-DC converter is varied from said safety mode of operation to a normal mode of operation for converting power of said DC power source received on said input of said DC-DC converter to converted power on said output of said DC-DC converter.

5. The apparatus of claim 1, wherein said DC-DC converter is configured to vary operation between a safety mode of operation and a normal mode of operation based on detecting a change in the signal superimposed on said output, wherein the DC-DC converter in the safety mode limits the power received by the inverter from said output of said DC-DC converter.

6. The apparatus of claim 5, wherein said DC-DC converter in said safety mode limits the power received by the inverter from said output of said DC-DC converter to less than a predetermined amount.

7. The apparatus of claim 5, wherein said DC-DC converter in said safety mode limits the power received by the inverter from said output of said DC-DC converter to less than a predetermined amount.

8. An apparatus comprising:
 a DC-DC converter, wherein said DC-DC converter includes an input configured to couple to a DC power source, and wherein said DC-DC converter includes an output;
 an inverter coupled to said output of said DC-DC converter, said inverter configured to convert power received from said output of said DC-DC converter; and
 a signaling mechanism circuit between said inverter and said DC-DC converter, wherein said signaling mechanism circuit is adapted for controlling operation of said DC-DC converter, and wherein said signaling mechanism circuit includes a switch integrated with said inverter, said switch modulating a signal onto said output of said DC-DC converter.

9. An apparatus comprising:
 a DC-DC converter, wherein said DC-DC converter includes an input configured to couple to a DC power source, and wherein said DC-DC converter includes an output;

an inverter coupled to said output of said DC-DC converter, said inverter configured to convert power received from said output of said DC-DC converter and provide said converted power to an electrical grid;

a signaling mechanism circuit between said inverter and said DC-DC converter, wherein said signaling mechanism circuit is adapted for controlling operation of said DC-DC converter; and a detector in said DC-DC converter adapted for detecting a signal at a frequency of said electrical grid.

10. The apparatus of claim 9, wherein said DC-DC converter is configured to vary operation between a safety mode and a normal mode based on a change in the detected signal, wherein the DC-DC converter in the safety mode limits the power received by the inverter from said output of said DC-DC converter.

11. An apparatus comprising:

a DC-DC converter, wherein said DC-DC converter includes an input configured to couple to a DC power source, and wherein said DC-DC converter includes an output;

an inverter coupled to said output of said DC-DC converter, said inverter configured to convert power received from said output of said DC-DC converter and provide said converted power to an electric grid;

a signaling mechanism circuit between said inverter and said DC-DC converter, wherein said signaling mechanism circuit is adapted for controlling operation of said DC-DC converter; and a detector in said DC-DC converter adapted for detecting on said output of said DC-DC converter a signal from said electrical grid and wherein said signal is detected at a higher frequency up converted from the frequency of said electrical grid.

12. An apparatus comprising:

a DC-DC converter, wherein said DC-DC converter includes an input configured to couple to a DC power source, and wherein said DC-DC converter includes an output;

an inverter coupled to said output of said DC-DC converter, said inverter configured to convert power received from said output of said DC-DC converter and provide said converted power to an electric grid;

a signaling mechanism circuit between said inverter and said DC-DC converter, wherein said signaling mechanism circuit is adapted for controlling operation of said DC-DC converter; and a detector in said DC-DC converter adapted for detecting a signal at a switching frequency of said inverter.

13. A method comprising:

monitoring a signal superimposed on an output of a DC-DC converter, wherein the signal is superimposed by an inverter coupled to the output of the DC-DC converter; and varying operation of the DC-DC converter between a safety mode of operation and a normal mode of operation based on a change in the monitored signal, wherein the DC-DC converter in the safety mode limits DC converted power provided from said output of said DC-DC converter to the inverter.

14. The method, according to claim 13, wherein said DC-DC converter in said safety mode limits the DC converted power to less than a predetermined amount characterized by having less than ten milliamperes of current flow at less than 10 Volts through said output of said DC-DC converter.

15. The method, according to claim 13, further comprising the steps of:

upon detecting said monitored signal, increasing said DC converted power provided to said inverter by operating said DC-DC converter in the normal mode by converting power from a DC power source to said DC converted power on said output of the DC-DC converter.

16. The method, according to claim 15, further comprising:

upon detecting said monitored signal and prior to said operating of said DC-DC converter in said normal mode of operation, slowly ramping up voltage of said DC converter power on said output of said DC-DC converter.

17. The method, according to claim 13, wherein said normal mode of operation of said DC-DC converter includes controlling a maximum peak power at an input of the DC-DC converter coupled to said DC power source.

18. The method according to claim 13, wherein said DC-DC converter in said safety mode limits the power to less than a predetermined amount.

* * * * *

UNITED STATES PATENT AND TRADEMARK OFFICE
CERTIFICATE OF CORRECTION

| | | |
|---|---|---|
| PATENT NO. | : 8,531,055 B2 | Page 1 of 1 |
| APPLICATION NO. | : 12/329525 | |
| DATED | : September 10, 2013 | |
| INVENTOR(S) | : Meir Adest | |

It is certified that error appears in the above-identified patent and that said Letters Patent is hereby corrected as shown below:

On the Title Page

Page 6, Column 1, Other Publications, Line 11:
    Delete "Instutte" and insert --Institute--

Page 6, Column 1, Other Publications, Line 16:
    Delete "Coupany," and insert --Company,--

Page 6, Column 2, Other Publications, Line 31:
    Delete "Infroanrition" and insert --Information--

In the Specification

Column 9, Detailed Description, Line 47:
    After "of", insert --module--

Signed and Sealed this
Second Day of June, 2015

Michelle K. Lee
*Director of the United States Patent and Trademark Office*